United States Patent
Choi et al.

(10) Patent No.: US 8,109,753 B2
(45) Date of Patent: *Feb. 7, 2012

(54) DOUBLE-SIDED NANO-IMPRINT LITHOGRAPHY SYSTEM

(75) Inventors: Byung-Jin Choi, Austin, TX (US); Sidlgata V. Sreenivasan, Austin, TX (US)

(73) Assignee: Molecular Imprints, Inc., Austin, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 12/684,538

(22) Filed: Jan. 8, 2010

(65) Prior Publication Data

US 2010/0112116 A1  May 6, 2010

Related U.S. Application Data

(63) Continuation of application No. 11/625,082, filed on Jan. 19, 2007, now Pat. No. 7,670,530.

(51) Int. Cl.
*B29C 59/00* (2006.01)
*B28B 17/00* (2006.01)

(52) U.S. Cl. .......... 425/385; 425/150; 264/293
(58) Field of Classification Search .......... 425/385, 425/149, 150; 264/293
See application file for complete search history.

(56) References Cited

U.S. PATENT DOCUMENTS

| | | | |
|---|---|---|---|
| 6,517,995 B1 * | 2/2003 | Jacobson et al. | 430/320 |
| 6,762,826 B2 * | 7/2004 | Tsukamoto et al. | 355/72 |
| 2005/0156342 A1 * | 7/2005 | Harper et al. | 264/40.1 |
| 2005/0172848 A1 * | 8/2005 | Olsson | 101/493 |

FOREIGN PATENT DOCUMENTS

| | | | |
|---|---|---|---|
| WO | WO 01/40875 A1 * | 6/2001 | |
| WO | WO 2005/010986 * | 3/2005 | |

* cited by examiner

*Primary Examiner* — Maria Veronica Ewald
(74) *Attorney, Agent, or Firm* — Cameron A. King

(57) ABSTRACT

A nano-imprint lithography system is described for patterning first and second substrates, the system includes a translation stage constructed to alternatively place substrate chucks in position with respect to a nano-imprint mold assembly such that the nano-imprint mold assembly may imprint a pattern on one of the substrates, while concurrently obtaining a desired spatial relationship for the remaining substrate.

18 Claims, 26 Drawing Sheets

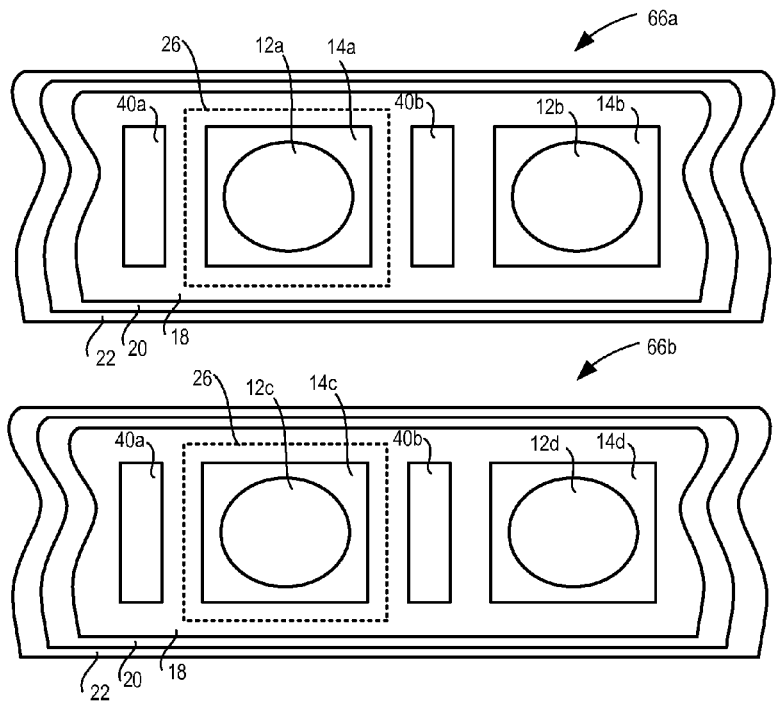
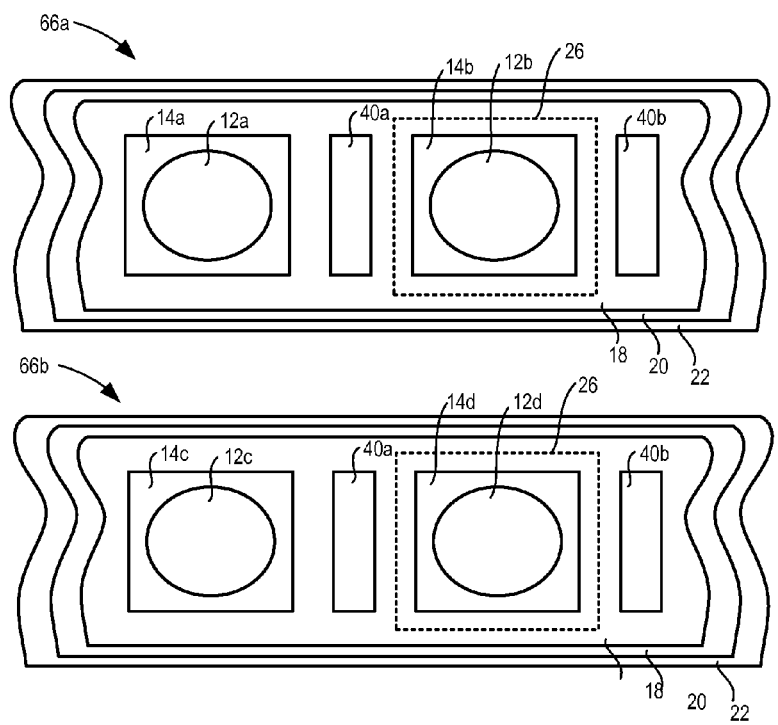

DOUBLE-SIDED NANO-IMPRINT LITHOGRAPHY SYSTEM

CROSS-REFERENCE TO RELATED APPLICATIONS

The present application is a Continuation of U.S. application Ser. No. 11/625,082 filed Jan. 19, 2007. Application Ser. No. 11/625,082 claims priority to U.S. Provisional Application No. 60/760,738 filed on Jan. 20, 2006, U.S. Provisional Application No. 60/827,125 filed on Sep. 27, 2006, and U.S. Provisional Application No. 60/788,808 filed on Apr. 3, 2006. Application Ser. No. 11/625,082 is also a Continuation-in-Part of U.S. application No. 11/565,350 filed on Nov. 30, 2006, which claims priority to U.S. Provisional Application No. 60/748,430 filed on Dec. 8, 2005. Each of the aforementioned Applications is incorporated herein by reference in its entirety.

BACKGROUND INFORMATION

Nano-fabrication involves the fabrication of very small structures, e.g., having features on the order of nanometers or smaller. One area in which nano-fabrication has had a sizeable impact is in the processing of integrated circuits. As the semiconductor processing industry continues to strive for larger production yields while increasing the circuits per unit area formed on a substrate, nano-fabrication becomes increasingly important. Nano-fabrication provides greater process control while allowing increased reduction of the minimum feature dimension of the structures formed. Other areas of development in which nano-fabrication has been employed include biotechnology, optical technology, mechanical systems and the like.

An exemplary nano-fabrication technique is commonly referred to as imprint lithography. Exemplary imprint lithography processes are described in detail in numerous publications, such as U.S. patent application publication 2004/0065976 filed as U.S. patent application Ser. No. 10/264,960, entitled, "Method to Arrange Features on a Substrate to Replicate Features having Minimal Dimensional Variability"; U.S. patent application publication 2004/0065252 filed as U.S. patent application Ser. No. 10/264,926, entitled "Method of Forming a Layer on a Substrate to Facilitate Fabrication of Metrology Standards"; and U.S. Pat. No. 6,936,194, entitled "Functional Patterning Material for Imprint Lithography Processes," all of which are assigned to the assignee of the present invention.

The imprint lithography technique disclosed in each of the aforementioned U.S. patent application publications and U.S. patent includes formation of a relief pattern in a polymerizable layer and transferring a pattern corresponding to the relief pattern into an underlying substrate. The substrate may be positioned upon a motion stage to obtain a desired position to facilitate patterning thereof. To that end, a template is employed spaced-apart from the substrate with a formable liquid present between the template and the substrate. The liquid is solidified to form a solidified layer that has a pattern recorded therein that is conforming to a shape of the surface of the template in contact with the liquid. The template is then separated from the solidified layer such that the template and the substrate are spaced-apart. The substrate and the solidified layer are then subjected to processes to transfer, into the substrate, a relief image that corresponds to the pattern in the solidified layer.

2

Figure 4:
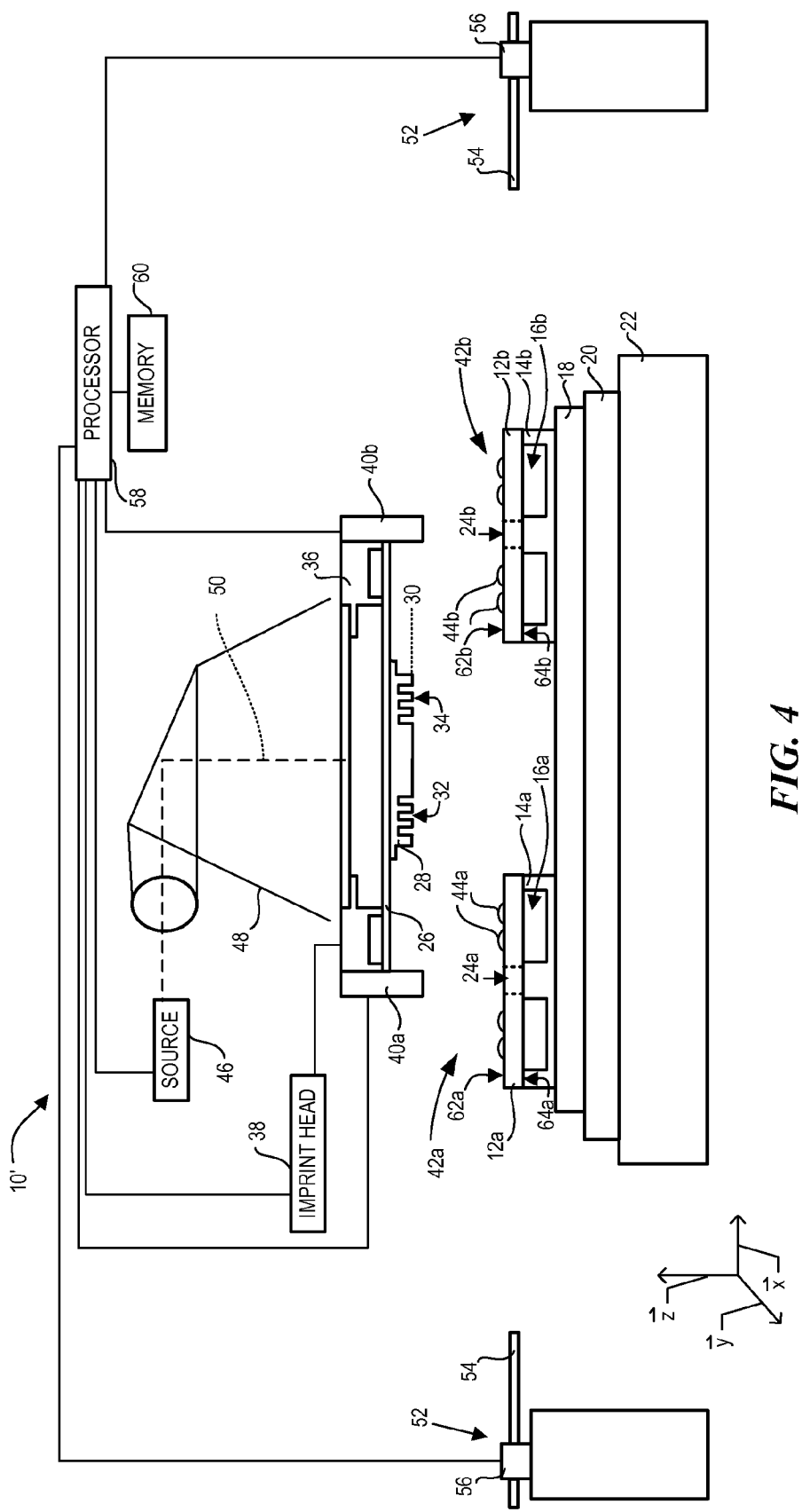
FIG. 4 is a simplified side view of a lithographic system having a mold spaced-apart from first and second substrates positioned on first and second substrate chucks, respectively.
Figure 7:
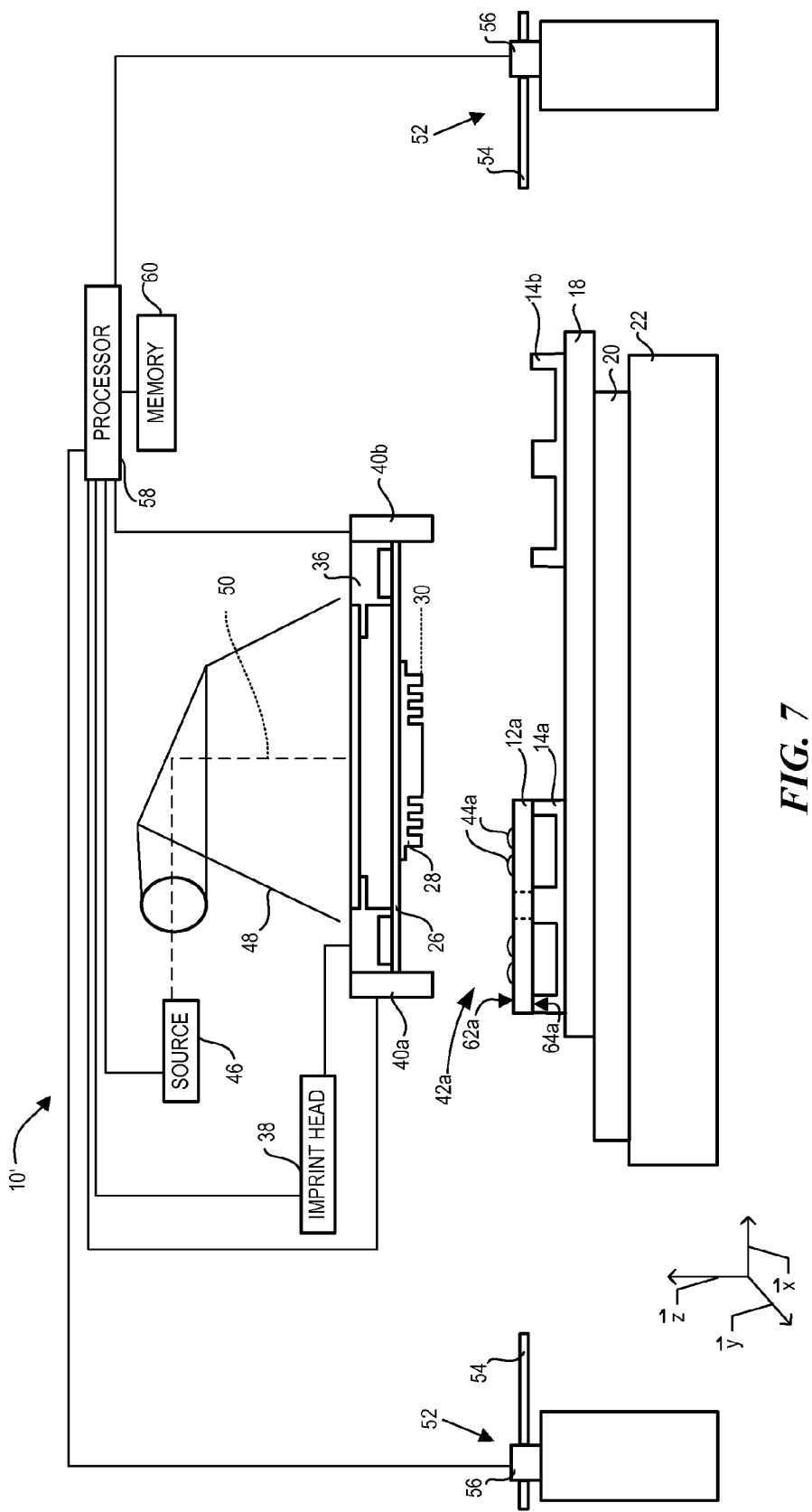
FIG. 7 is a simplified side view of the lithographic system shown in FIG. 6, with the first substrate having a material positioned thereon.
Figure 8:
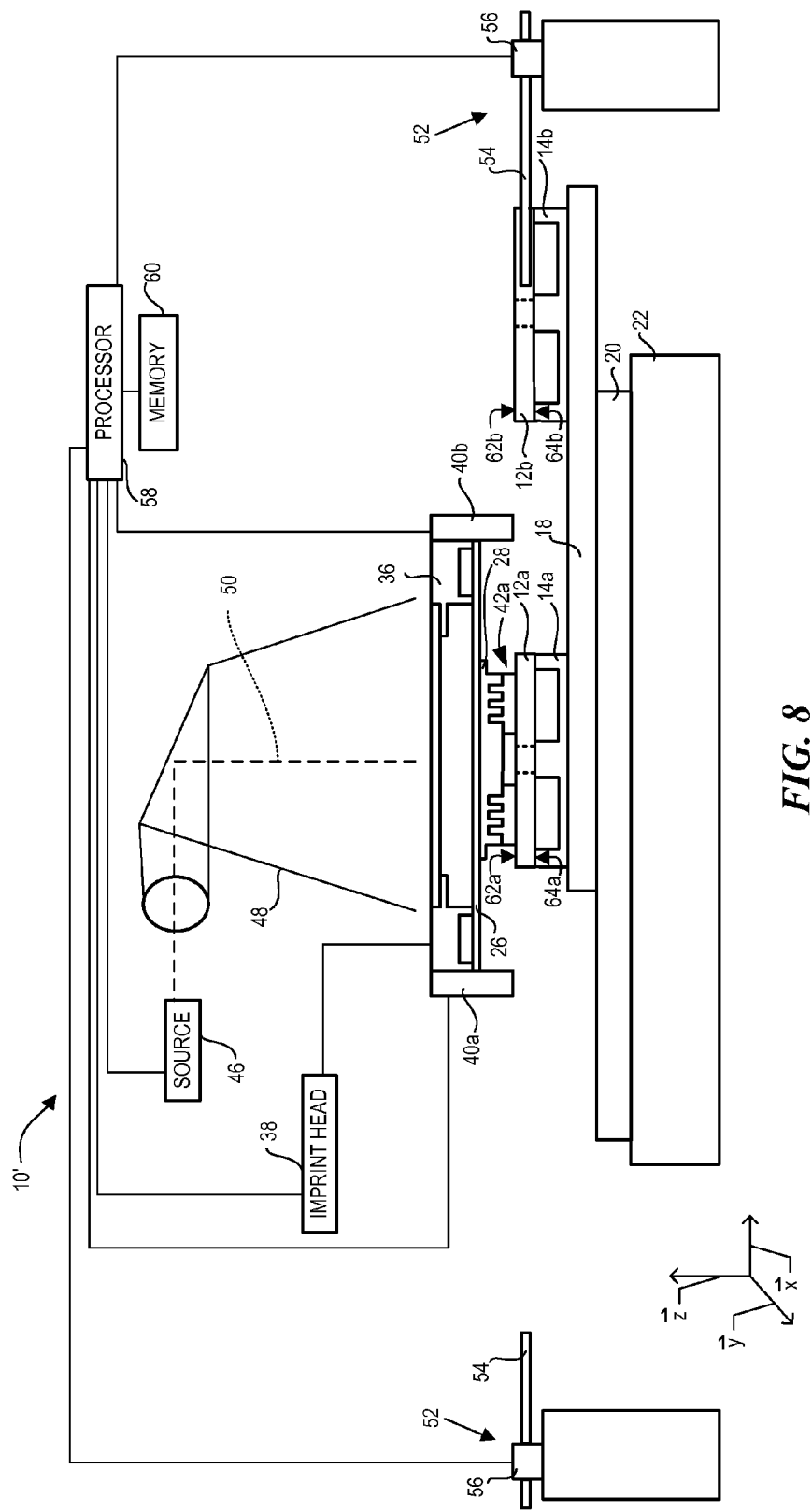
Figure 9:
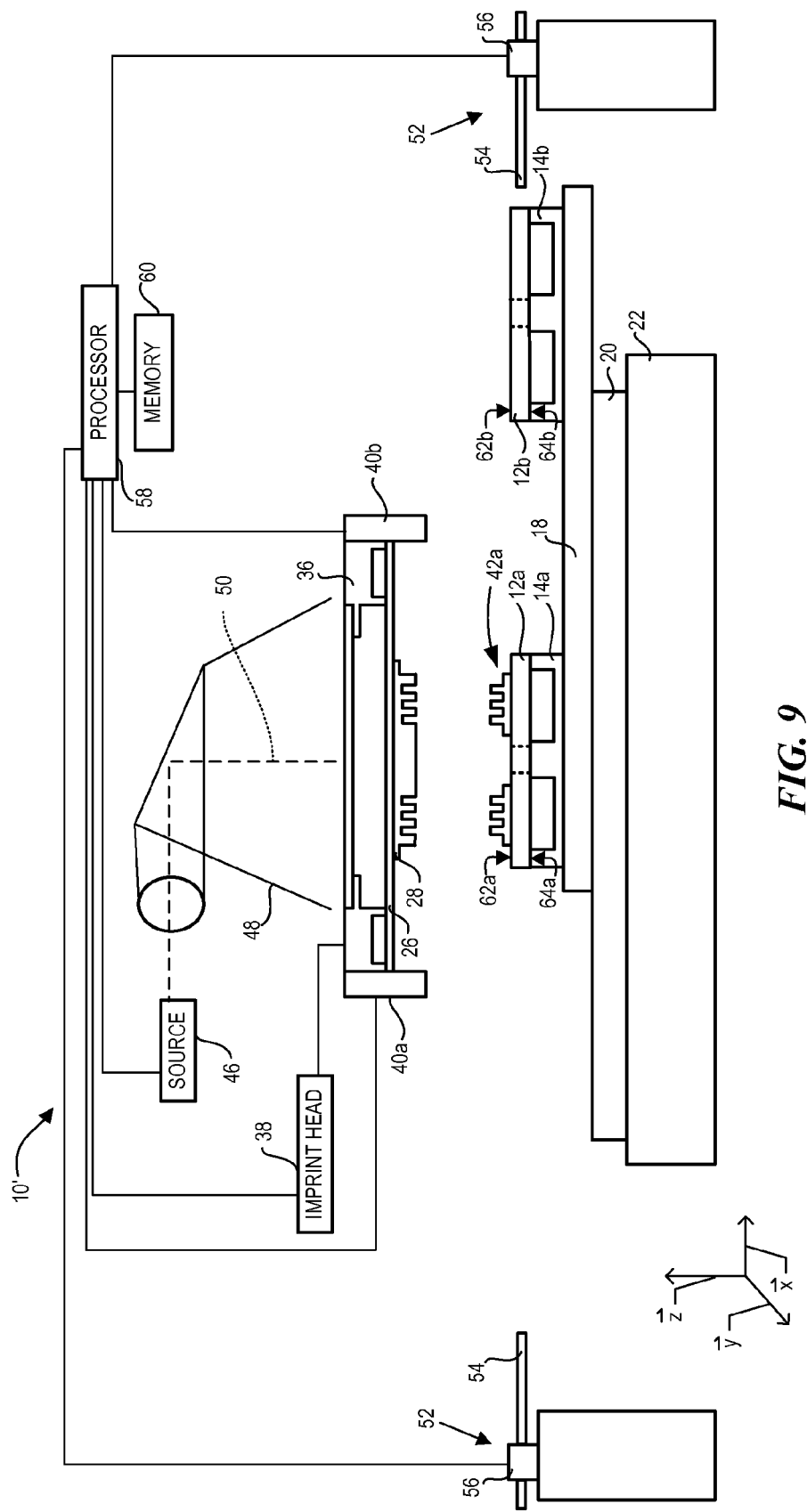
Figure 10:
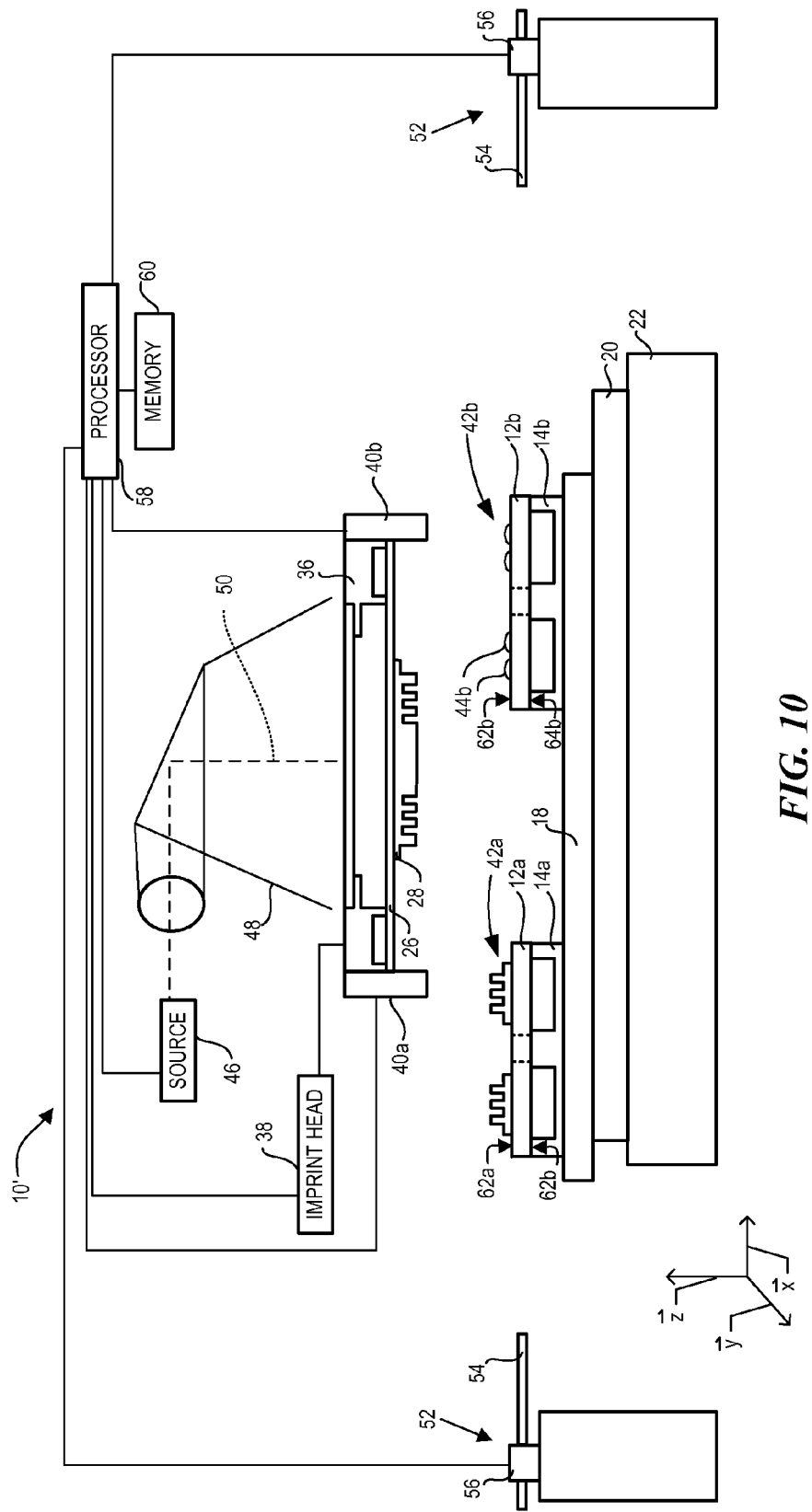
Figure 11:
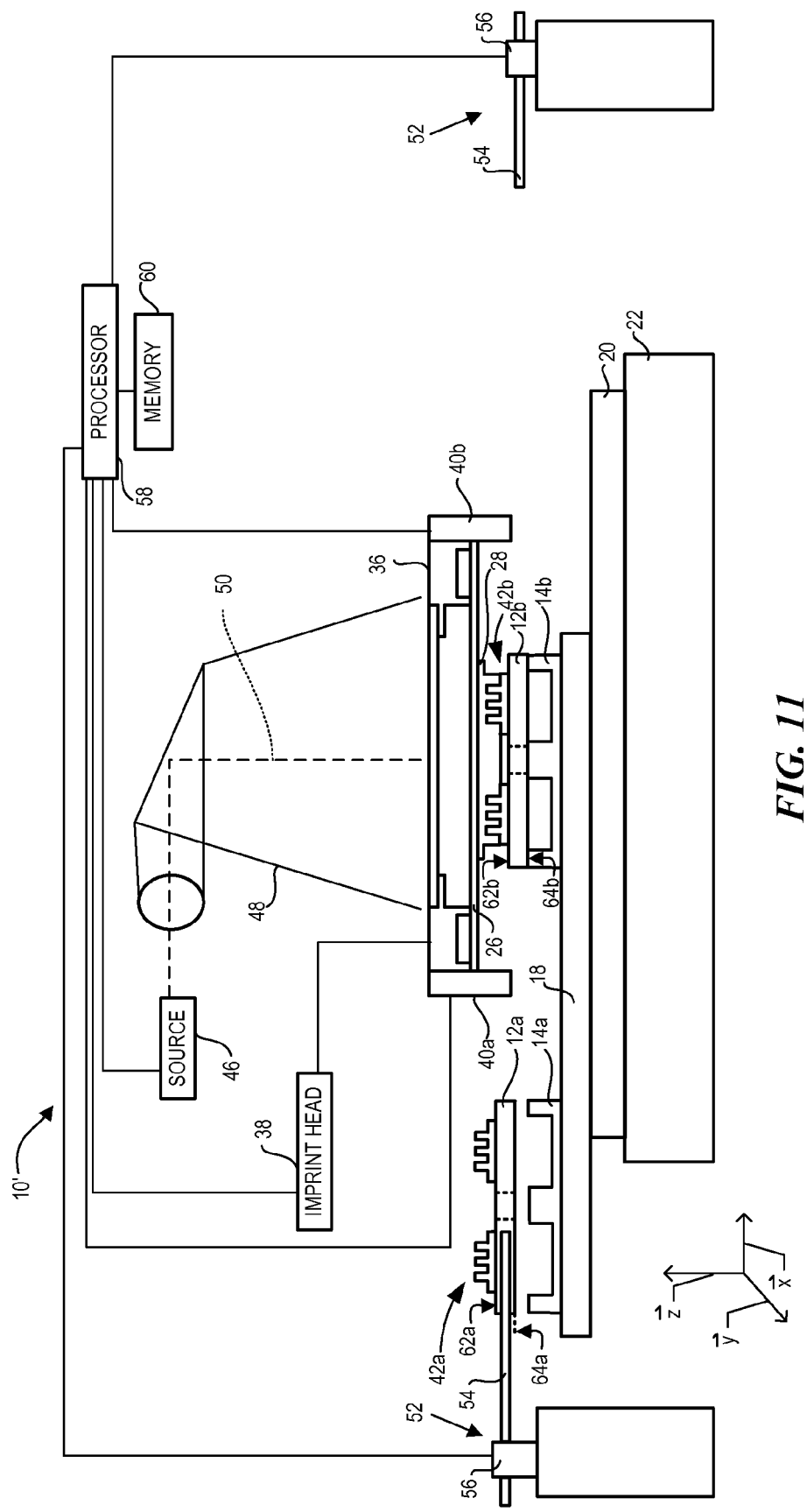
Figure 12:
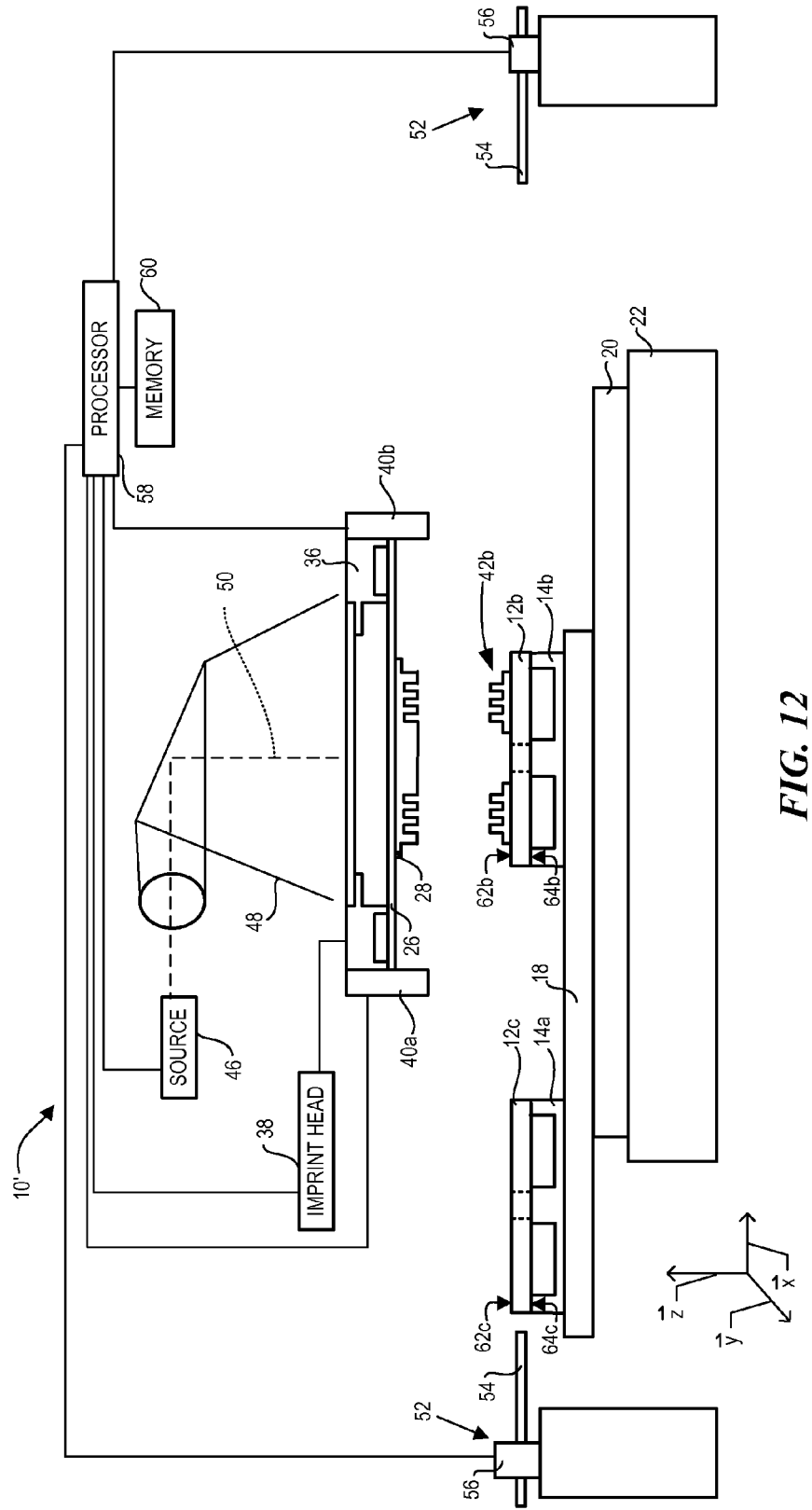
Figure 13:
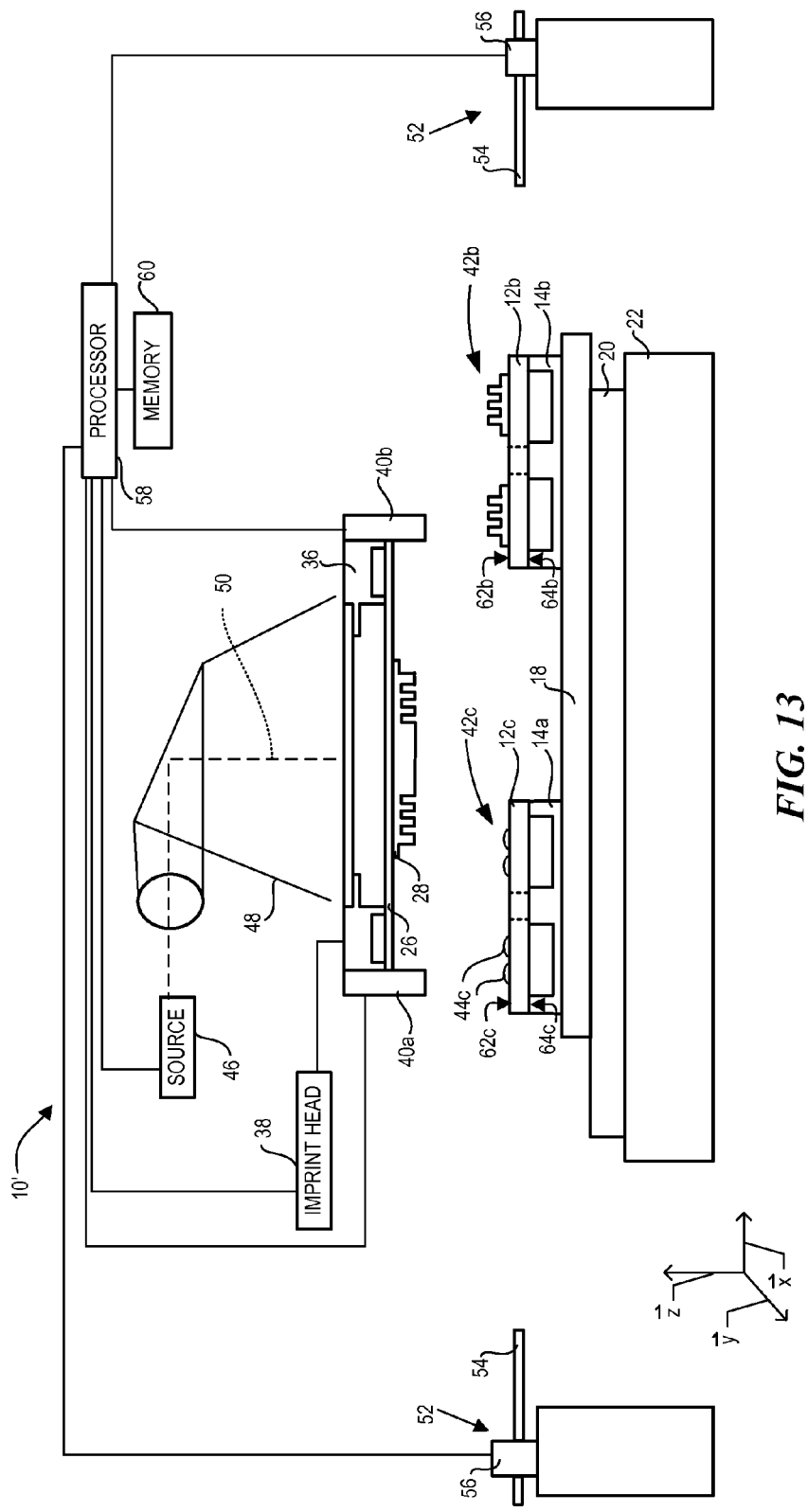
Figure 14:
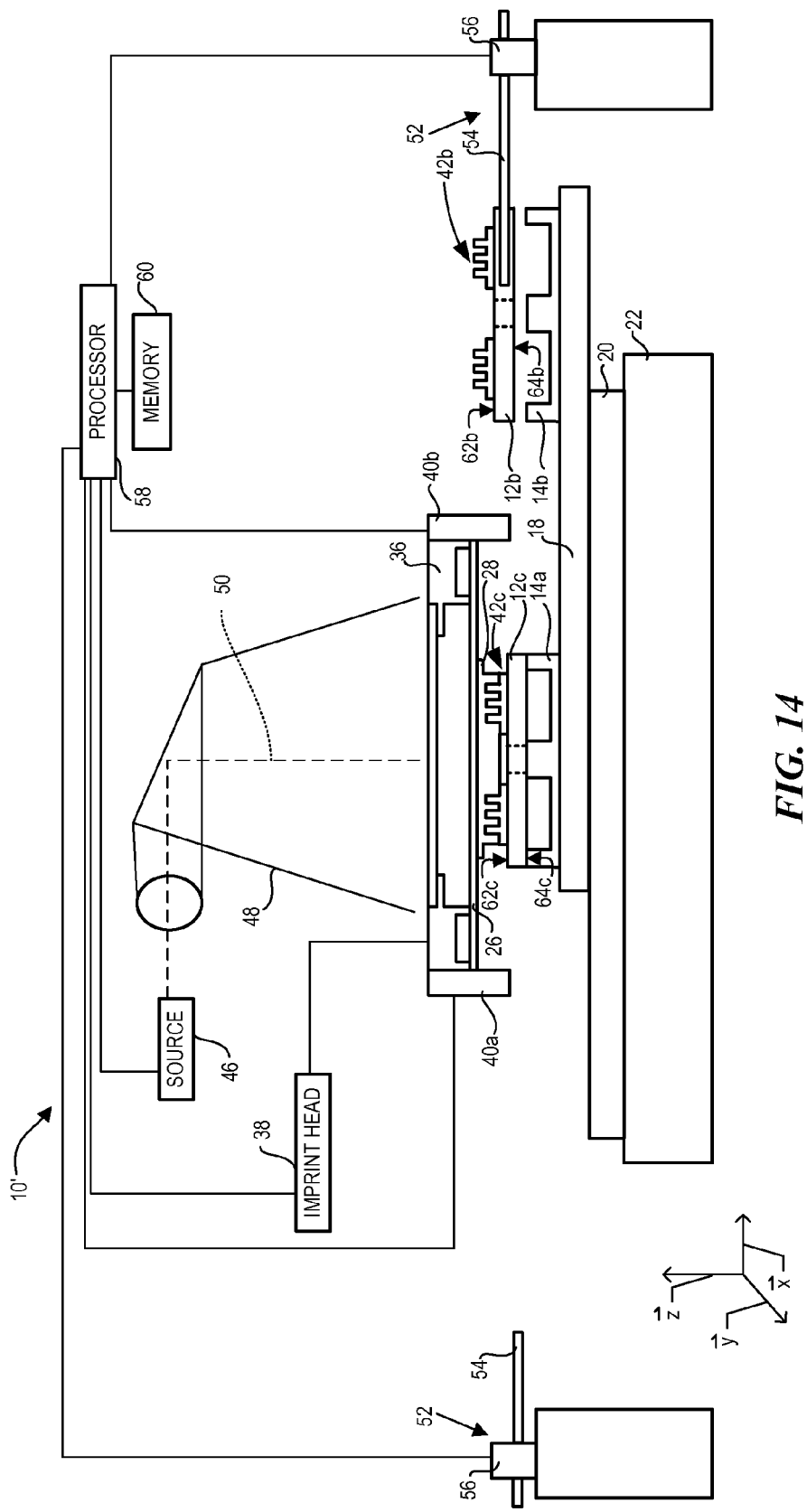
Figure 15:
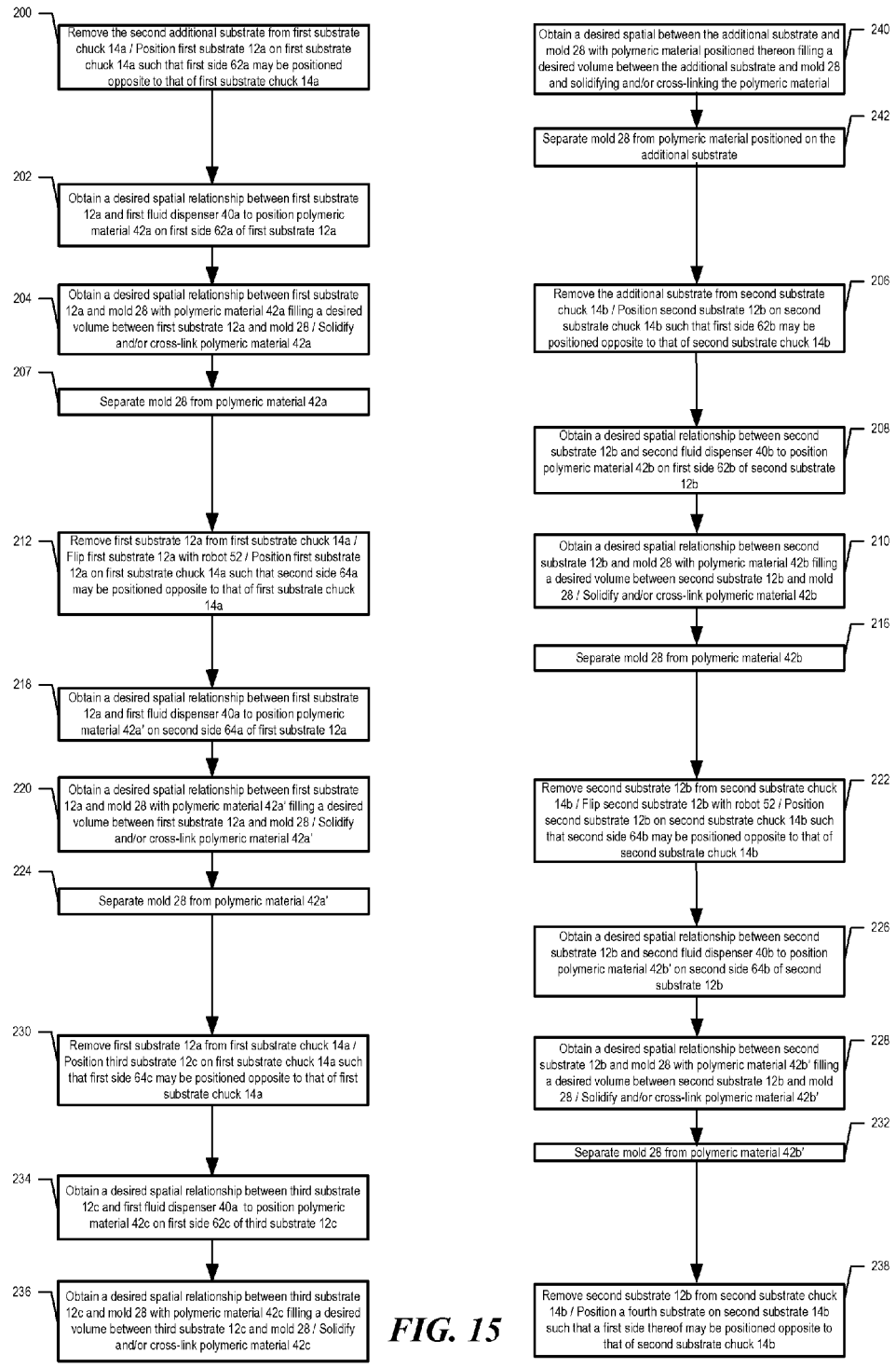
Figure 16:
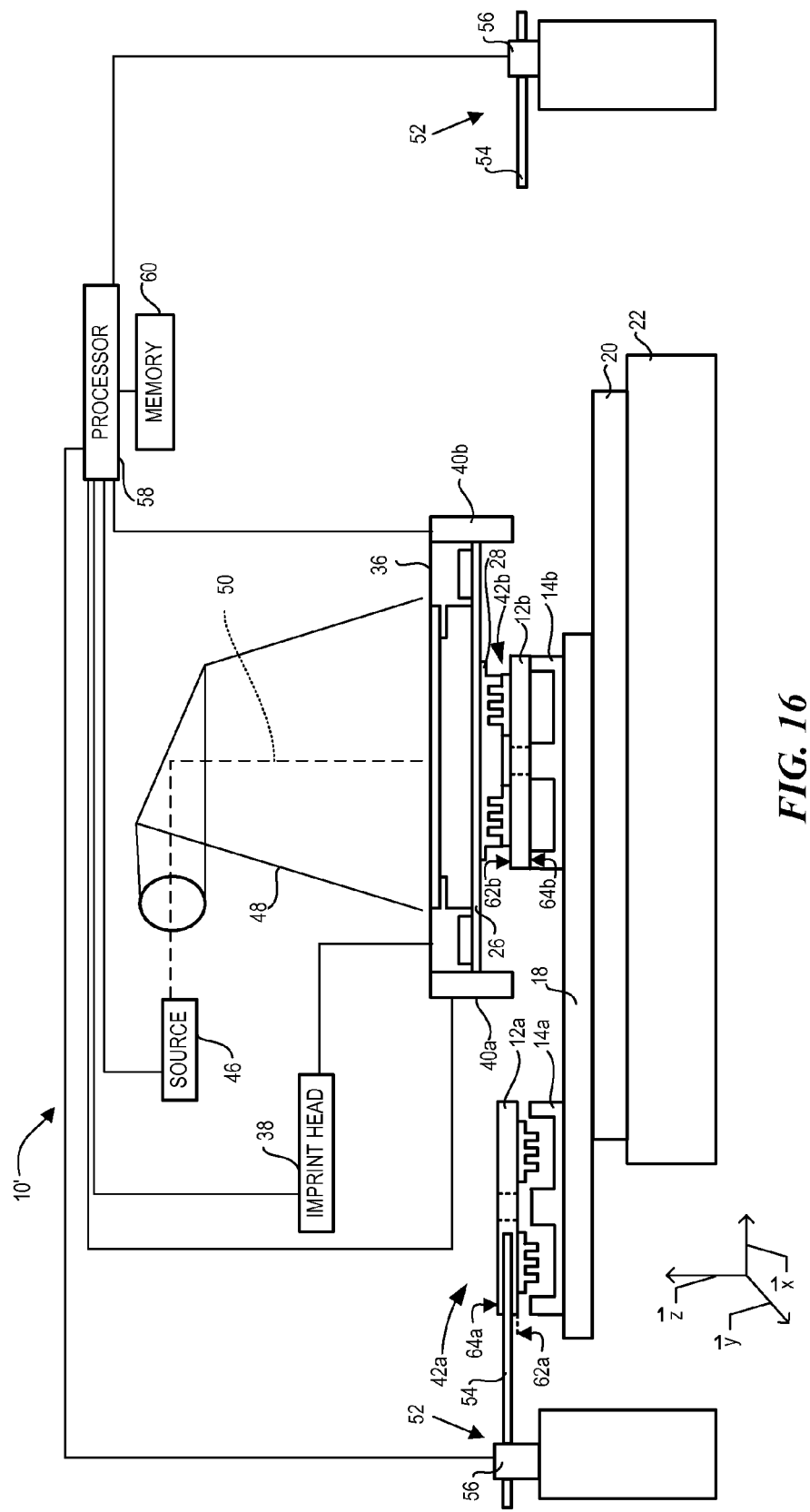
Figure 17:
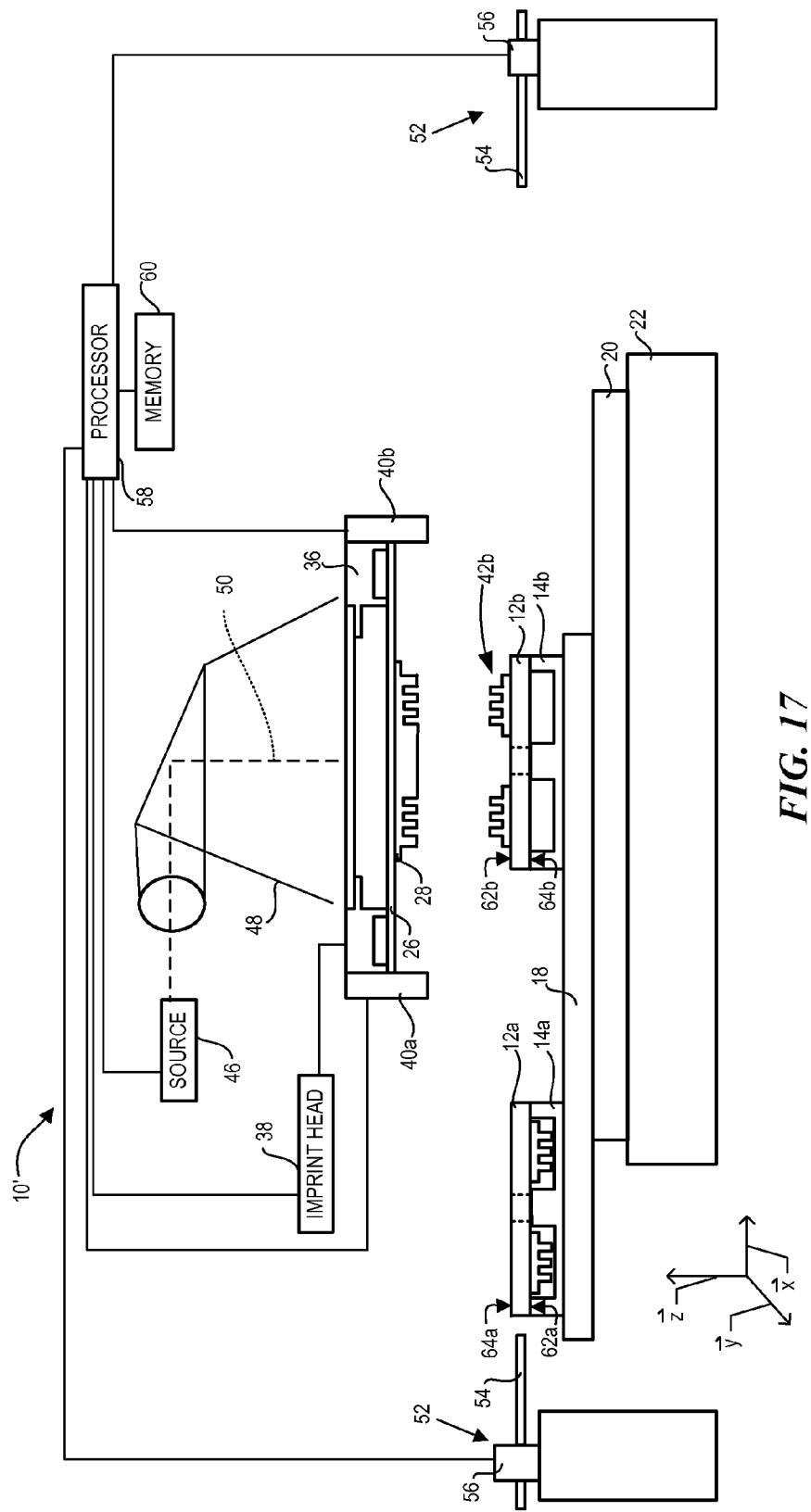
Figure 18:
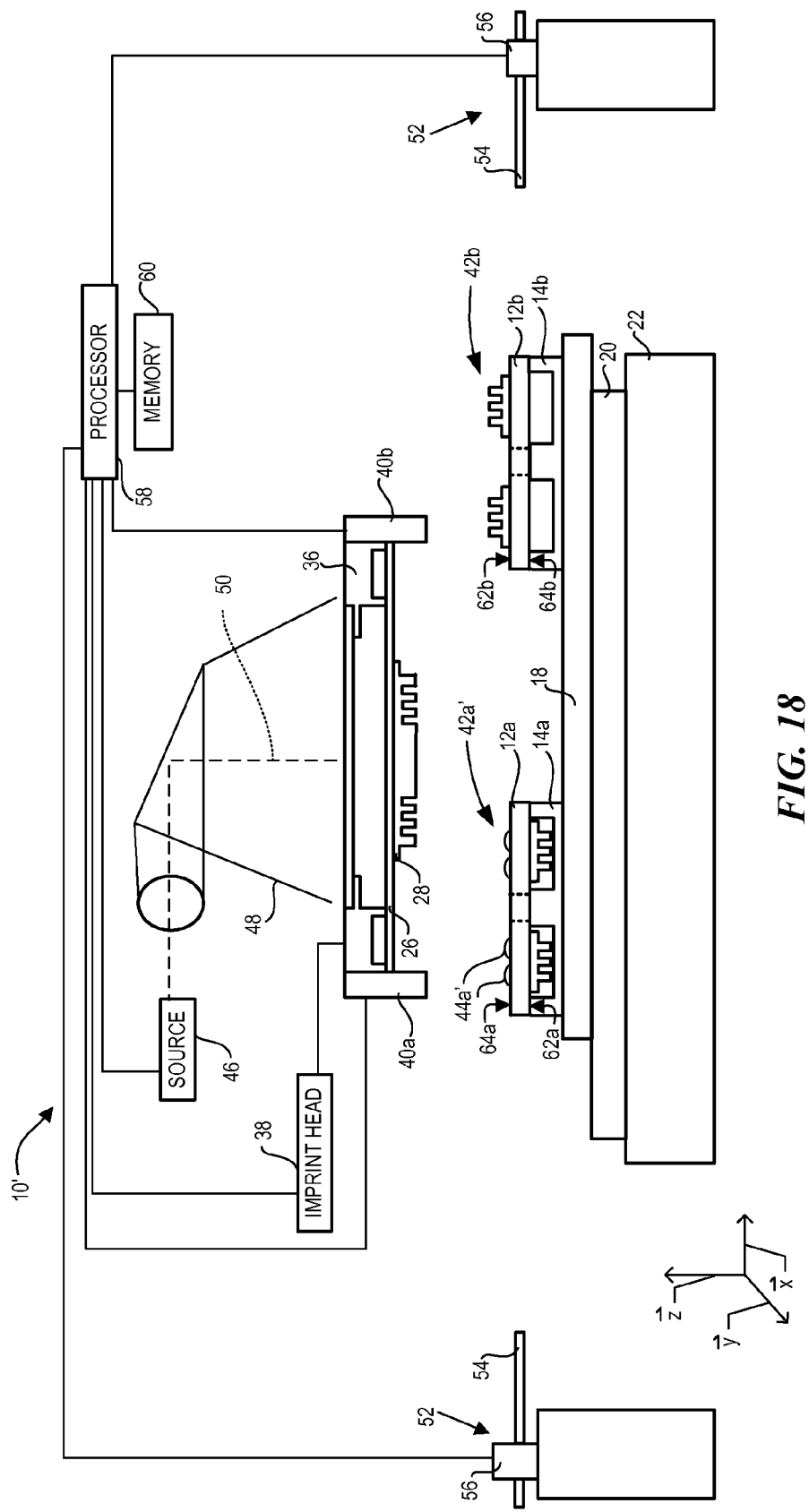
Figure 19:
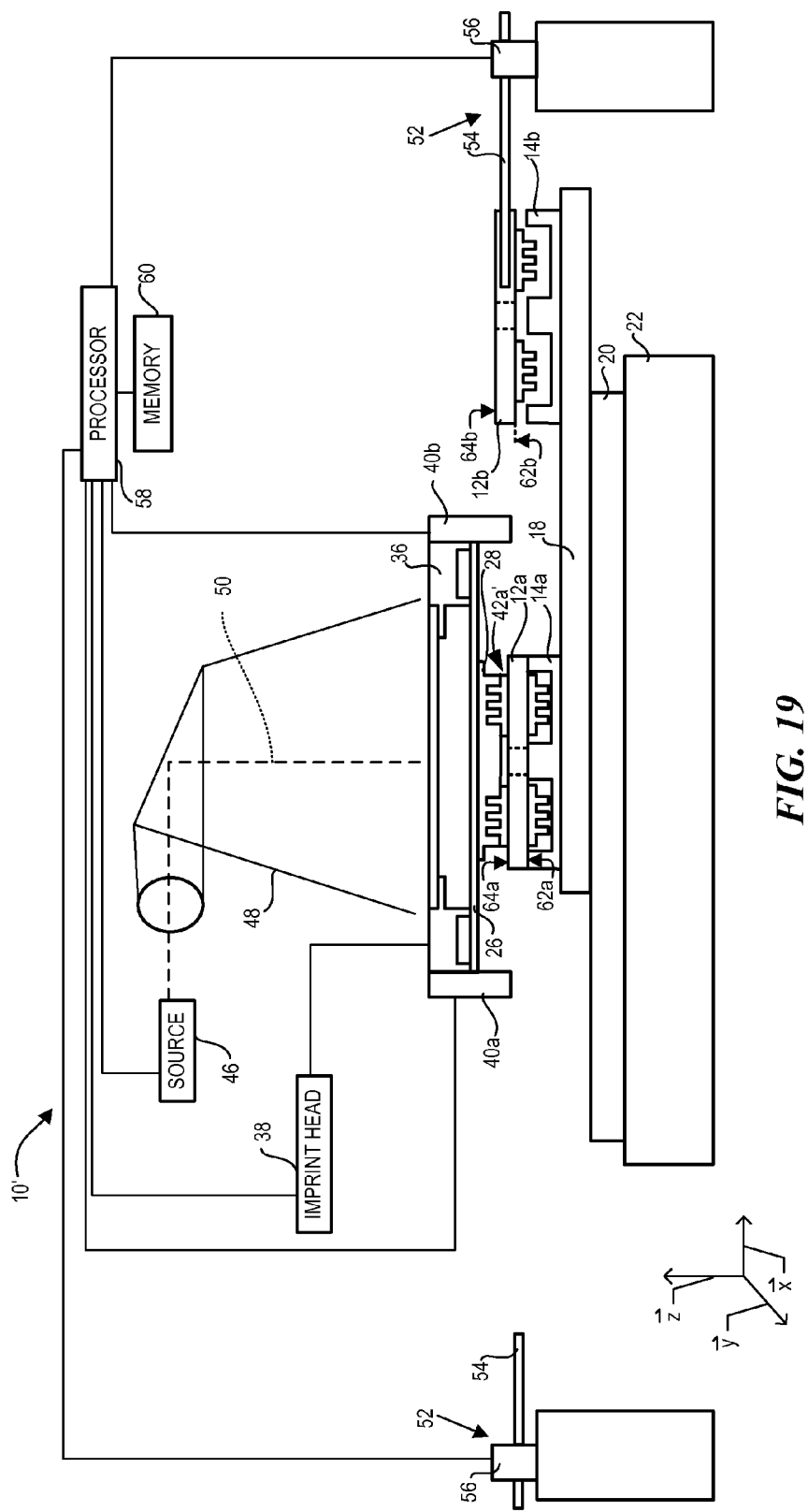
Figure 20:
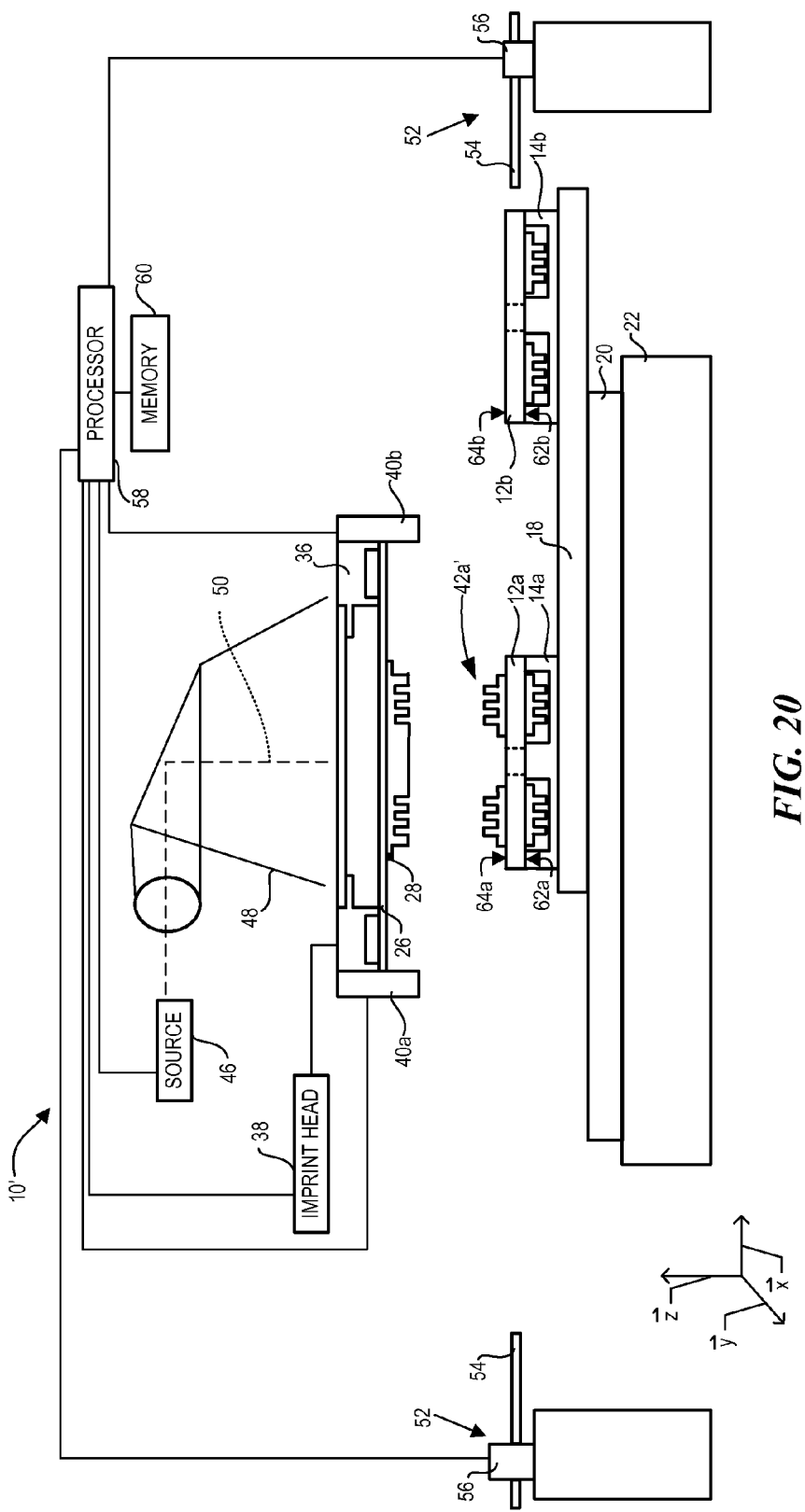
Figure 21:
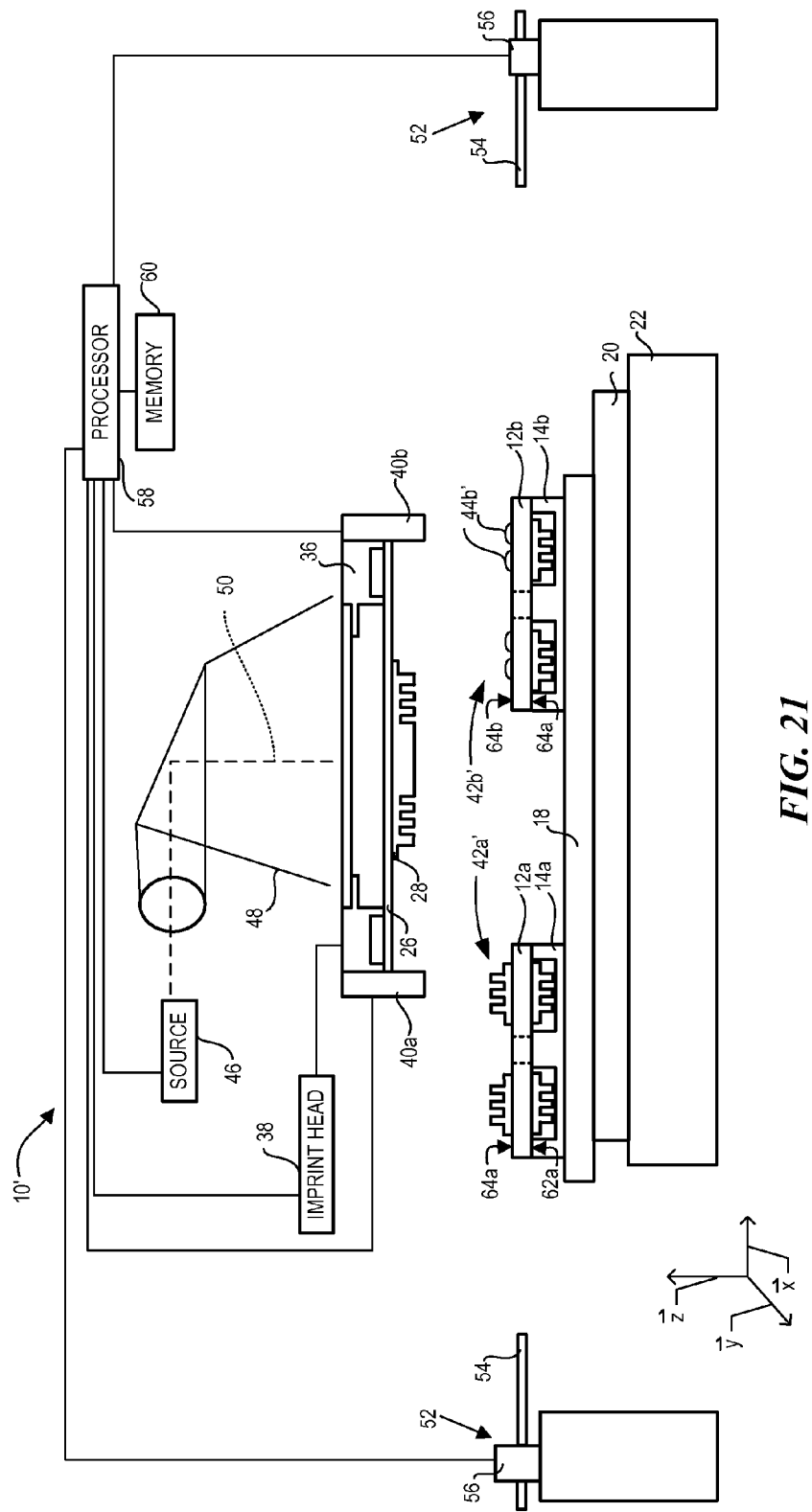
Figure 22:
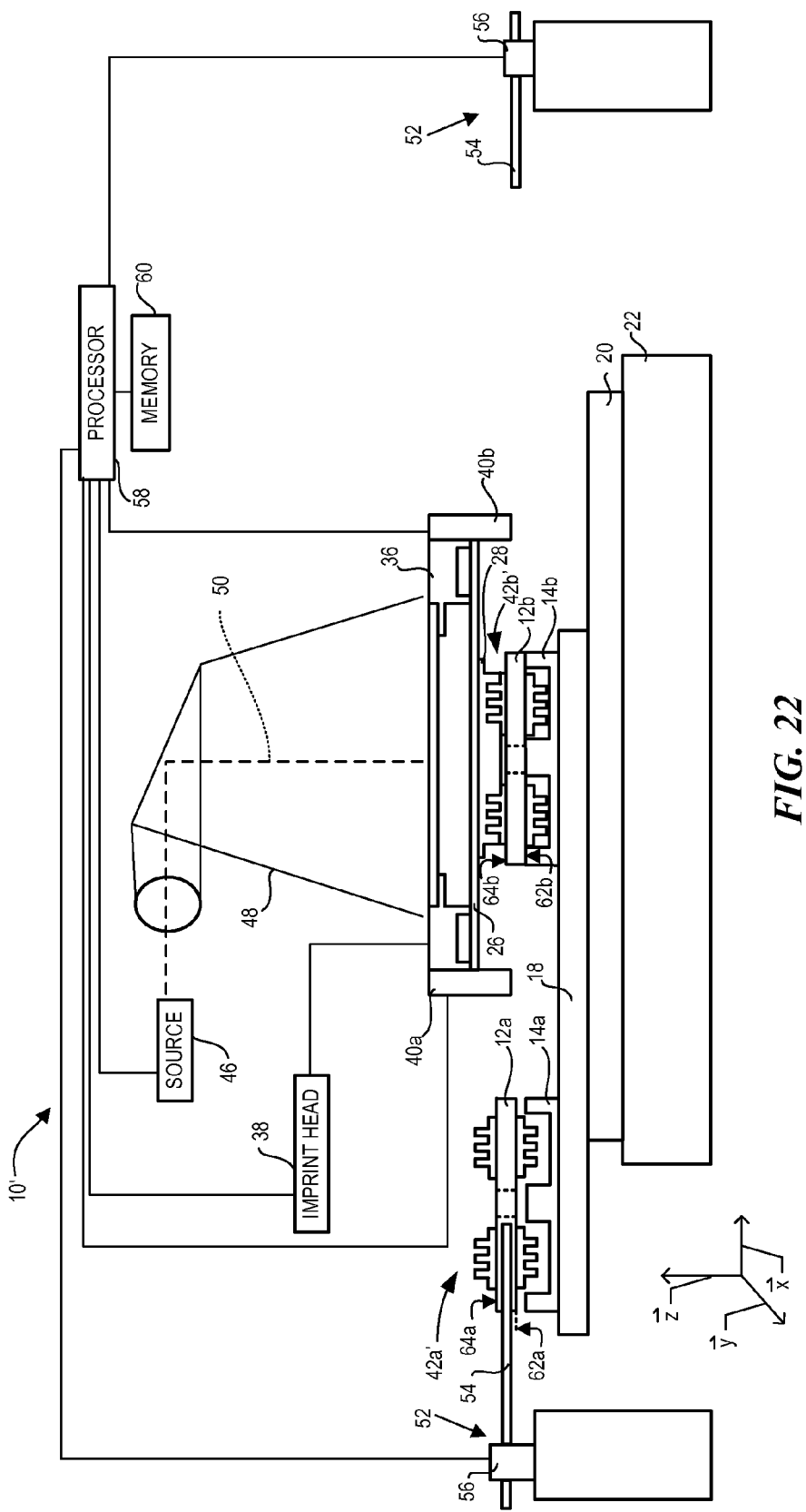
Figure 23:
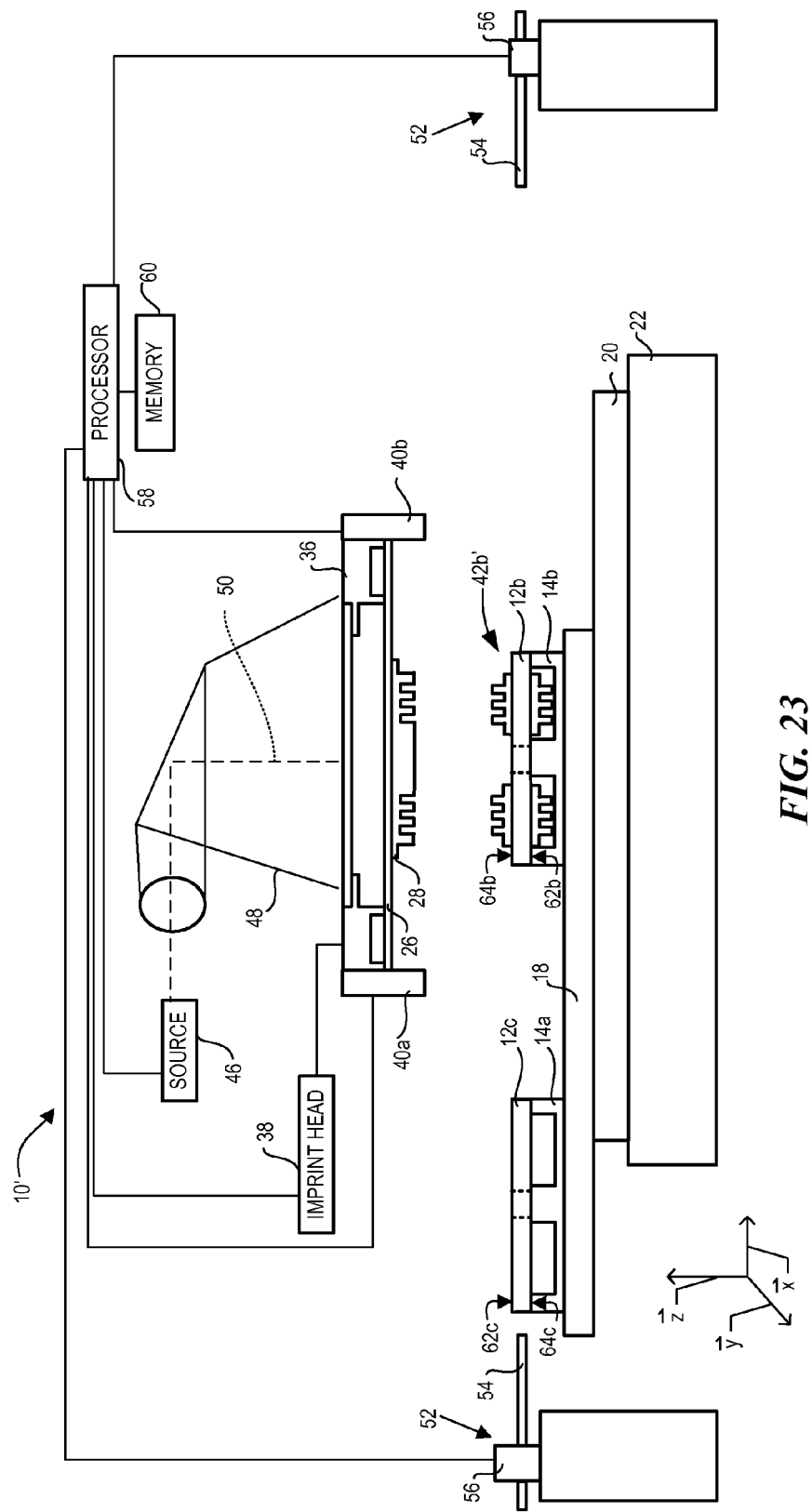
Figure 24:
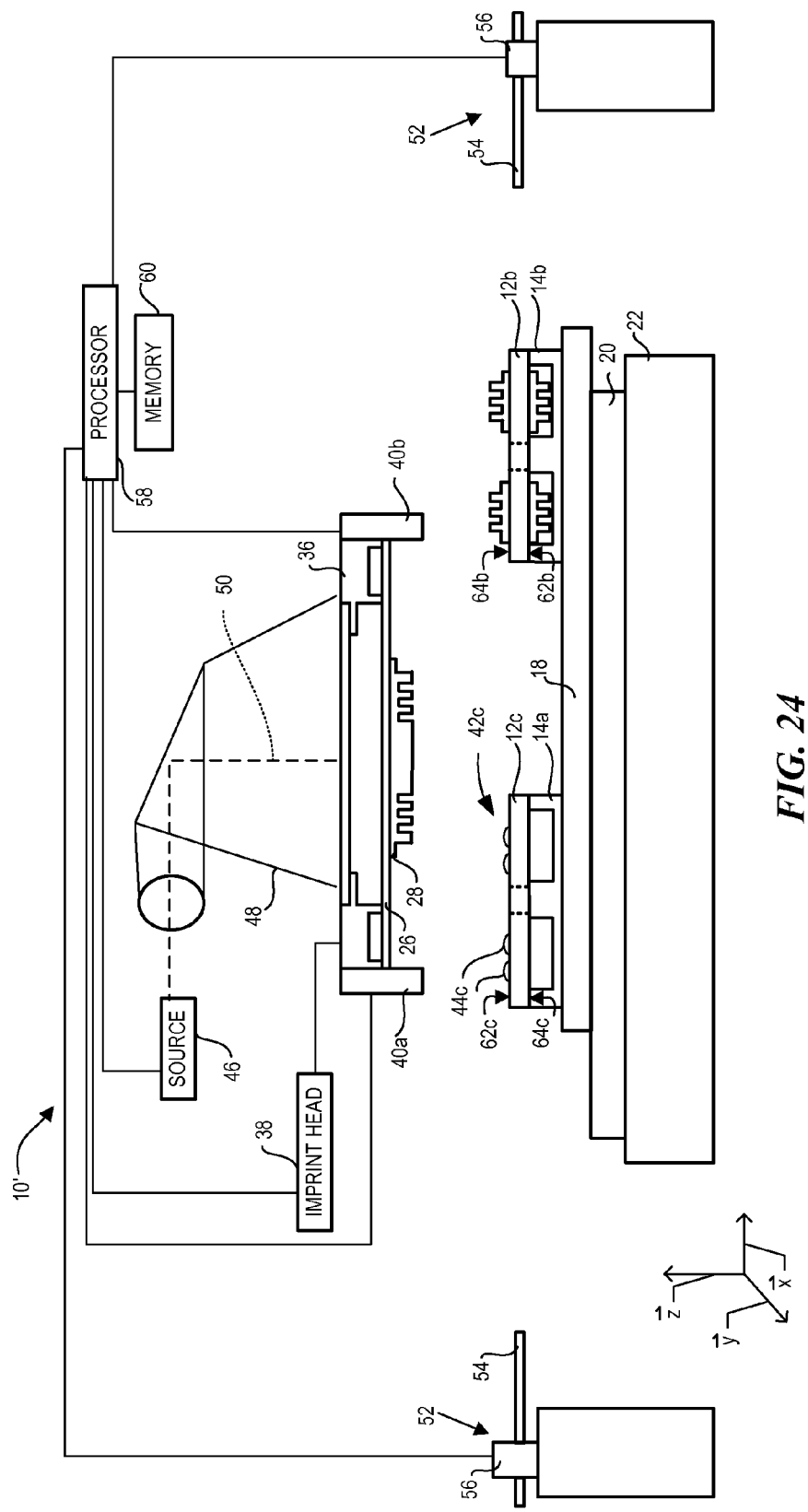
Figure 25:
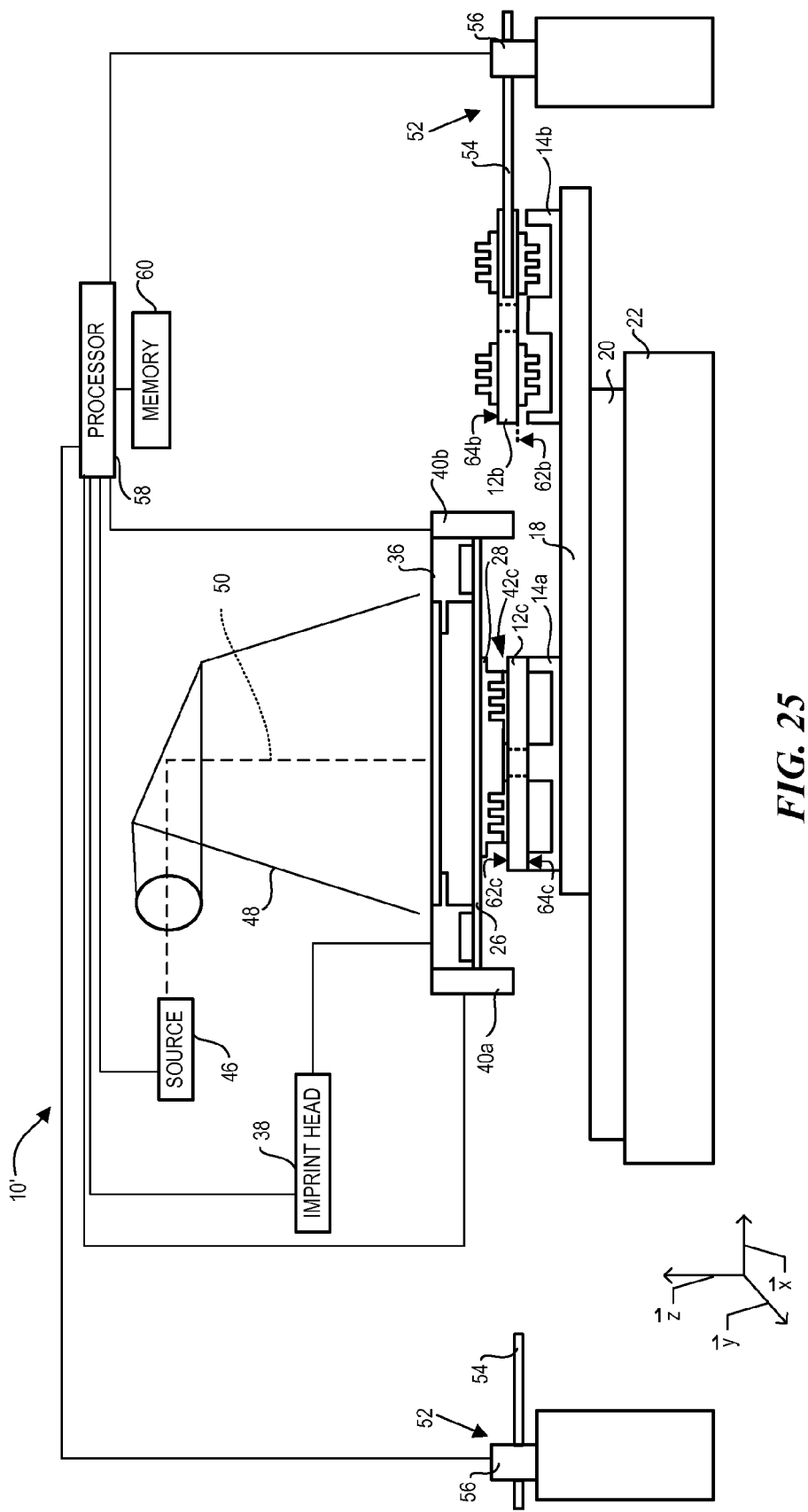
Figure 28:
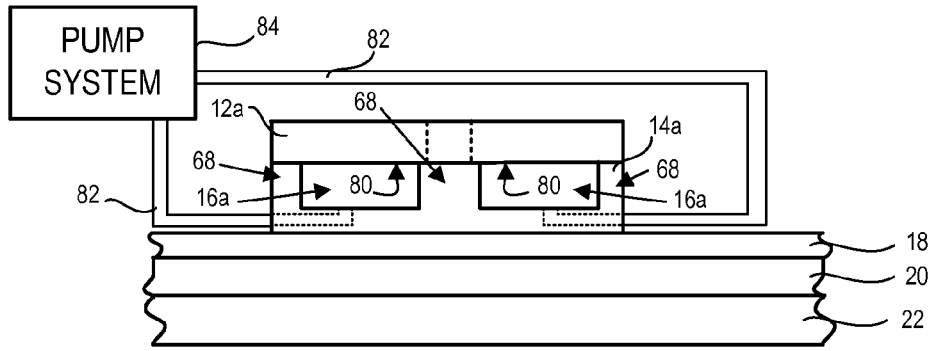
Figure 29:
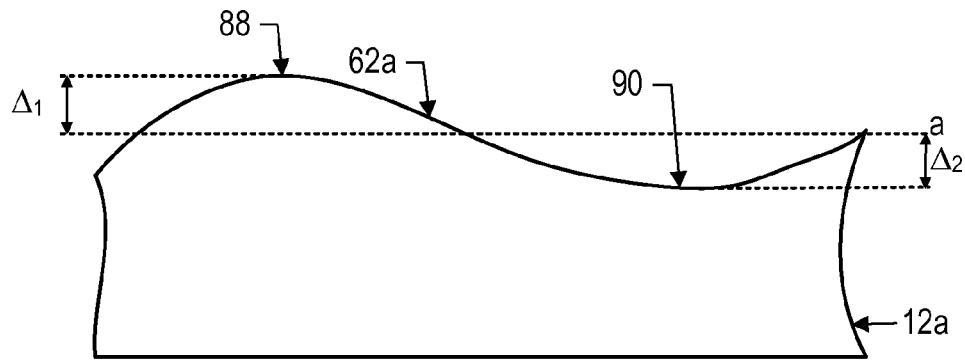

FIG. 8 is a simplified side view of the lithographic system shown in FIG. 7, with the mold contacting the material positioned on the first substrate and the robot positioning the second substrate on the second substrate chuck;

FIG. 9 is a simplified side view of the lithographic system shown in FIG. 8, with the mold being separated from the material on the first substrate;

FIG. 10 is a simplified side view of the lithographic system shown in FIG. 9, with the second substrate having a material positioned thereon;

FIG. 11 is a simplified side view of the lithographic system shown in FIG. 10, with the mold contacting the material positioned on the second substrate and the robot removing the first substrate from the first substrate chuck;

FIG. 12 is a simplified side view of the lithographic system shown in FIG. 11, with the mold being separated from the material on the second substrate and a third substrate positioned on the first substrate chuck;

FIG. 13 is a simplified side view of the lithographic system shown in FIG. 12, with the third substrate having a material positioned thereon;

FIG. 14 is a simplified side view of the lithographic system shown in FIG. 13, with the mold contacting the material positioned on the third substrate and the robot removing the second substrate from the second substrate chuck;

FIG. 15 is a flow diagram showing a method of patterning first and second sides of the first and second substrates shown in FIG. 4;

FIG. 16 is a simplified side diagram of the lithographic system shown in FIG. 10, with the mold contacting the material positioned on the second substrate and the robot flipping the first substrate with respect to the mold;

FIG. 17 is a simplified side view of the lithographic system shown in FIG. 16, with the mold being separated from the material on the second substrate and the first substrate positioned on the first substrate chuck in a second position;

FIG. 18 is a simplified side view of the lithographic system shown in FIG. 17, with the first substrate having a material positioned thereon;

FIG. 19 is a simplified side view of the lithographic system shown in FIG. 18, with the mold contacting the material positioned on the first substrate and the robot flipping the second substrate with respect to the mold;

FIG. 20 is a simplified side view of the lithographic system shown in FIG. 19, with the mold being separated from the material on the first substrate and the second substrate positioned on the second substrate chuck in a second position;

FIG. 21 is a simplified side view of the lithographic system shown in FIG. 20, with the second substrate having a material positioned thereon;

FIG. 22 is a simplified side view of the lithographic system shown in FIG. 21, with the mold contacting the material positioned on the second substrate and the robot removing the first substrate from the first substrate chuck;

FIG. 23 is a simplified side view of the lithographic system shown in FIG. 22, with the mold being separated from the material on the second substrate and a third substrate positioned on the first substrate chuck;

FIG. 24 is a simplified side view of the lithographic system shown in FIG. 23, with the third substrate having a material positioned thereon;

FIG. 25 is a simplified side view of the lithographic system shown in FIG. 24 with the mold contacting the material positioned on the third substrate and the robot removing the second substrate from the second substrate chuck;

FIG. 26 is a simplified top down view of the lithographic system shown in FIG. 4, with the lithographic system have first and second modules each comprising first and second substrate chucks, with the first substrates being patterned;

FIG. 27 is a simplified top down view of the lithographic system shown in FIG. 4, with the lithographic system have first and second modules each comprising first and second substrate chucks, with the second substrates being patterned;

FIG. 28 is a simplified side view of a substrate chuck having a substrate positioned thereon;

FIG. 29 is an exploded view of a portion of the substrate shown in FIG. 4; and

Figure 30:
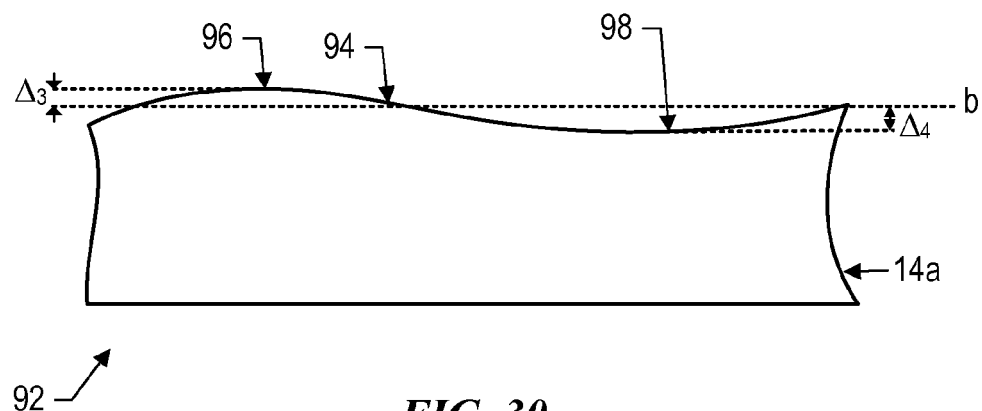

FIG. 30 is an exploded view of a portion of the substrate chuck shown in FIG. 4.

DETAILED DESCRIPTION

Figure 1:
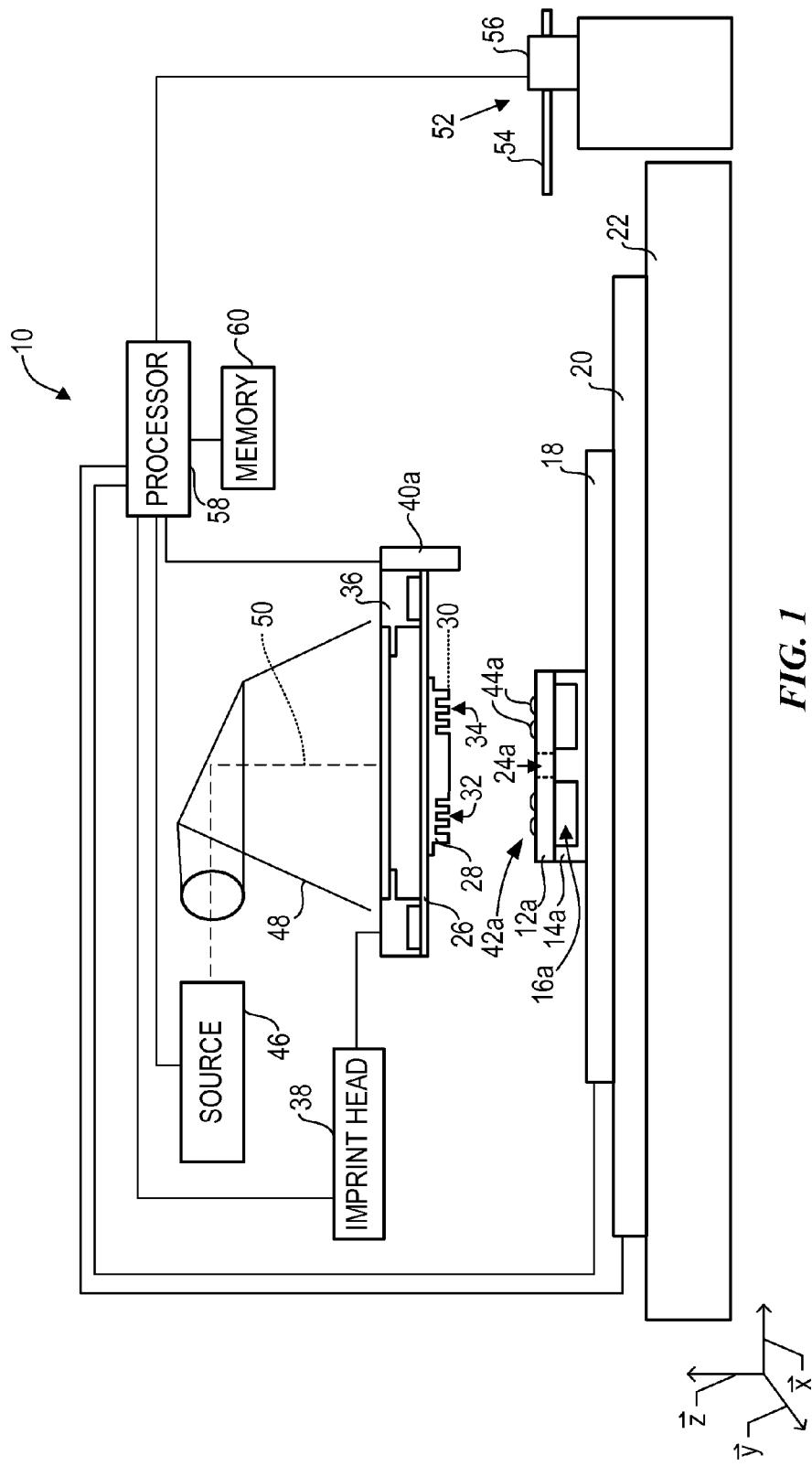
FIG. 1 is a simplified side view of a lithographic system having a mold spaced-apart from a substrate in accordance with the prior art.

Referring to FIG. 1, a system 10 is shown to form a relief pattern on a first substrate 12a. First substrate 12a may be coupled to a first substrate chuck 14a. First substrate chuck 12a may be any chuck including, but not limited to, vacuum, pin-type, groove type, or electromagnetic, as described in U.S. Pat. No. 6,873,087 entitled "High-Precision Orientation Alignment and Gap Control Stages for Imprint Lithography Processes," which is incorporated herein by reference. First substrate chuck 14a may comprise a cavity 16a facing first substrate 12a. First substrate 12a and first substrate chuck 14a may be supported on a first stage 18 and a second stage 20, with first stage 18 being positioned between first substrate chuck 14a and second stage 20. Further, first and second stages 18 and 20 may be positioned on a base 22. First stage 18 may provide motion about a first axis while second stage 20 may provide motion about a second axis, the second axis being orthogonal to the first axis, i.e. the first and second axes being the x and y axes. Exemplary stages in the present invention are available under part numbers XM200L350 and XM200S50, both from Newport Corporation of Irvine, Calif. First substrate 12a may further comprise a throughway 24a. However, in a further embodiment, first substrate 12a may be substantially absent of throughway 24a.

Spaced-apart from first substrate 12a is a template 26 having a mesa 28 extending therefrom towards first substrate 12a with a patterning surface 30 thereon. Mesa 28 may also be referred to as a mold 28. Mesa 28 may also be referred to as a nano-imprint mold 28. In a further embodiment, template 26 may be substantially absent of mold 28. Template 26 and/or mold 28 may be formed from such material including but not limited to, fused-silica, quartz, silicon, organic polymers, siloxane polymers, borosilicate glass, fluorocarbon polymers, metal, and hardened sapphire. As shown patterning surface 30 comprises features defined by a plurality of spaced-apart recesses 32 and protrusions 34. However, in a further embodiment, patterning surface 30 may be substantially smooth and/or planar. Patterning surface 30 may define an original pattern that forms the basis of a pattern to be formed on first substrate 12a, described further below. Template 26 may be coupled to a template chuck 36, template chuck 36 being any chuck including, but not limited to, vacuum, pin-type, groove type, or electromagnetic, as described in U.S. Pat. No. 6,873,087. Further, template chuck 36 may be coupled to an imprint head 38 to facilitate movement of template 26 and mold 28. In an example, imprint head 38 may be a three degree-of-freedom (two tilting motions and one translational motion) stage controlled by a three-voice coil actuators (not shown) or other linear actuators (not shown).

System 10 further comprises a first fluid dispenser 40a. First fluid dispenser 40a may be in fluid communication with first substrate 12a so as to position a polymeric material 42a thereon, described further below. As shown first fluid dispenser 40a is coupled to template chuck 36; however, in a further embodiment, first fluid dispenser 40a may be coupled to any part of system 10, i.e., template 26 or imprint head 38. Further, system 10 may comprise any number of fluid dispensers and first fluid dispenser 40a may comprise a plurality of dispensing units therein. Exemplary fluid dispensers in the present invention are available under the part name Leopard from Xaar Corporation located in Cambridge, United Kingdom.

Polymeric material 42a may be positioned upon first substrate 12a using any known technique, e.g., drop dispense, spin-coating, dip coating, thin film deposition, thick film deposition, and the like. As shown, polymeric material 42a may be positioned upon first substrate 12a as a plurality of spaced-apart droplets 44a. In an example, each droplet of droplets 44a may have a unit volume of approximately 6 pico-liters. Typically, polymeric material 42a may be positioned upon first substrate 12a before the desired volume is defined between mold 28 and first substrate 12a, described further below. However, polymeric material 42a may fill the volume after the desired volume has been obtained.

System 10 further comprises a source 46 of energy 48 to direct energy 48 along a path 50. Imprint head 38 and first and second stages 18 and 20 are configured to arrange mold 28 and first substrate 12a, respectively, to be in superimposition and disposed within path 50, described further below. Either imprint head 38, first and second stages 18 and 20, or a combination of the above, may vary a distance between mold 28 and first substrate 12a to define a desired volume therebetween that is filled by polymeric material 42a. In an example, source 46 may be a He lamp or He/Xe lamp or LED based source that may emit UV in the range of 300 to 380 nm.

Figure 2:
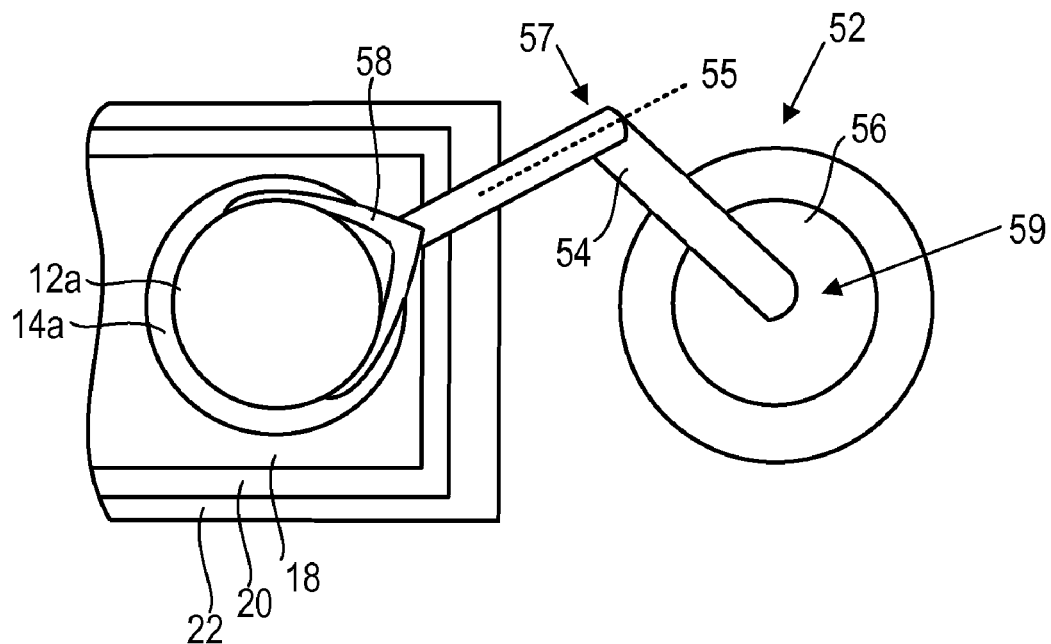
FIG. 2 is a top down view of a robot handling the substrate shown in FIG. 1.

Referring to FIGS. 1 and 2, system 10 further comprises a robot 52 for positioning first substrate 12a upon and removing first substrate 12a from first substrate chuck 14a. Robot 52 may be any handling robot known in the art. In an example, robot 52 comprises an arm 54 coupled to a driving means 56. Arm 54 further has an end effecter 58 coupled thereto to handle first substrate 12a. In an example, end effecter 58 may be an edge-gripping or thin air cavity chuck to hold substrate 12a without contacting an area of first substrate 12a having polymeric material 42a positioned thereon, respectively, i.e., the active area of substrate 12a. Driving means 56 many extend or contract arm 54, move arm 54 horizontally in a circle, or provide any desired motion of arm 54. Driving means 56 may also provide motion about the first and second axes mentioned above. Driving means 56 may also rotate about its axis, i.e., about a joint 59. Arm 54 may also rotate about an axis 55 to flip first substrate 12*a* 180° with respect to mold 28, described further below. Further, arm 54 may rotate about a joint 57. Furthermore, robot 52 may transport first substrate 12*a* between first substrate chuck 14*a* and a substrate cassette (not shown). The substrate cassette (not shown) may comprise a plurality of substrates therein.

Referring to FIG. 1, system 10 may be regulated by a processor 58 that is in data communication with first and second stages 18 and 20, imprint head 38, first fluid dispenser 40*a*, source 46, and robot 52, operating on a computer readable program stored in memory 60.

Figure 3:
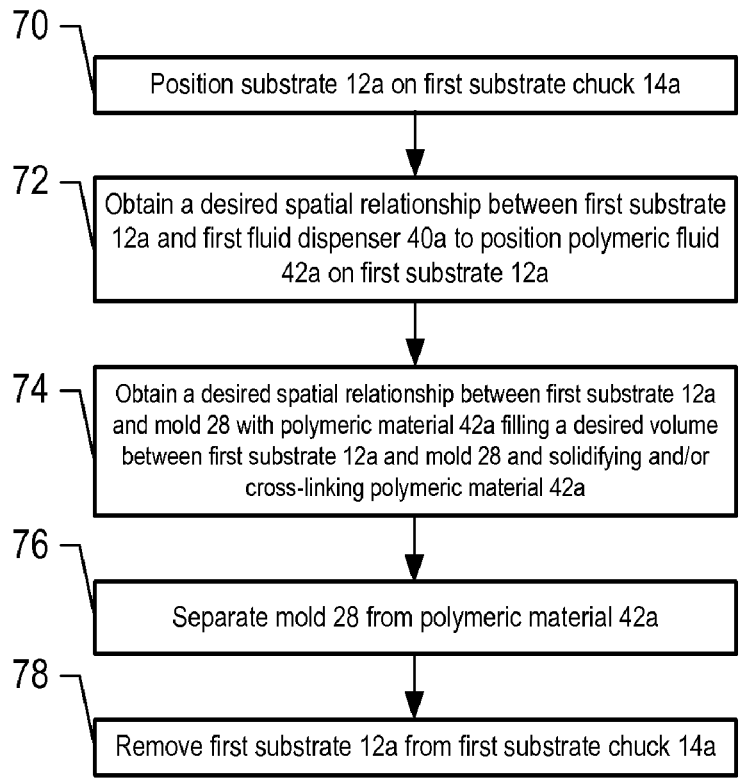
FIG. 3 is a flow diagram showing a method of patterning the substrate shown in FIG. 1.

Referring to FIGS. 1 and 3, in accordance with the prior art, a process flow for processing first substrate 12*a* is shown. At step 70, first substrate 12*a* may be positioned upon first substrate chuck 14*a*. More specifically, first and second stages 18 and 20 may position first substrate chuck 14*a* in a desired spatial relationship with respect to robot 52 such that robot 52 may position first substrate 12*a* upon first substrate chuck 14*a*. Robot 52 may transfer first substrate 12*a* from the substrate cassette (not shown) and position the same upon first substrate chuck 14*a*. At step 72, first and second stages 18 and 20 may translate first substrate 12*a* such that a desired position may be obtained between first substrate 12*a* and first fluid dispenser 40*a*. As a result, first fluid dispenser 40*a* may position polymeric material 42*a* upon first substrate 12*a*, as mentioned above. Polymeric material 42*a* may be a nano-imprint material.

At step 74, a desired spatial relationship may be obtained between first substrate 12*a* and mold 28. More specifically, first and second stages 18 and 20 and imprint head 38 may position first substrate chuck 14*a* such that first substrate 12*a* may be in superimposition with mold 28 and further polymeric material 42*a* fills the desired volume between first substrate 12*a* and mold 28. To facilitate filling of recessions 32, before contact between mold 28 and droplets 44*a*, the atmosphere between mold 28 and droplets 44*a* may be saturated with helium or is completely evacuated or is a partially evacuated atmosphere of helium. Further, at step 74, after the desired volume is filled with polymeric material 42*a*, source 46 may produce energy 48, e.g., broadband ultraviolet radiation that causes first polymeric material 42*a* to solidify and/or cross-link conforming to a shape of first substrate 12*a* and patterning surface 30 of mold 28.

At step 76, mold 28 may be separated from polymeric material 42*a* positioned on first substrate 12*a*. At step 78, first substrate 12*a* may be unloaded from first substrate chuck 14*a*. More specifically, first and second stages 18 and 20 may position first substrate 12*a* in a desired spatial relationship to robot 52 such that robot 52 may remove first substrate 12*a* from first substrate chuck 14*a* and position the same within the substrate cassette (not shown).

To that end, in an example, the aforementioned process for patterning first substrate 12*a* may have a total process time per substrate of thirty-four (34) seconds. More specifically, the time for each step of the aforementioned patterning process is shown more clearly in Chart 1:

CHART 1

| Process for patterning a substrate | Process time (secs) |
| --- | --- |
| 1 Position first substrate 12a on first substrate chuck 14a | 7 |
| 2 Obtain a desired spatial relationship between first substrate 12a and first fluid dispenser 40a to position polymeric material 42a on first substrate 12a | 1 |

CHART 1-continued

| Process for patterning a substrate | Process time (secs) |
| --- | --- |
| 3 Obtain a desired spatial relationship between first substrate 12a and mold 28 with polymeric material 42a filling a desired volume between first substrate 12a and mold 28 and solidifying and/or cross-linking polymeric material 42a | 18 |
| 4 Separate mold 28 from polymeric material 42a | 1 |
| 5 Remove first substrate 12a from first substrate chuck 14a | 7 |
| Total/Substrate | 34 |

To that end, the steps for the aforementioned method of processing first substrate 12*a* may be performed sequentially. As a result, a portion of system 10 may not be operating at full capacity, i.e., a portion of system 10 may remain idle with respect to the remaining portions of system 10. More specifically, the steps of 1) positioning first substrate 12*a* on first substrate chuck 14*a* (step 1); 2) obtaining a desired spatial relationship between first substrate 12*a* and mold 28 with polymeric material 42*a* filling a desired volume between first substrate 12*a* and mold 28 and solidifying and/or cross-linking polymeric material 42*a* (step 3); and 3) removing first substrate 12*a* from first substrate chuck 14*a* (step 5) comprise a majority of the process time to process first substrate 12*a*. As a result, inter alia, imprint head 38 and/or template 26 and/or mold 28 and/or robot 52 may be not be operating at full capacity, i.e., remain idle for periods of time, which may be undesirable. To that end, to maximize an efficiency of system 10, an optimization of the aforementioned method of patterning a substrate may be desired, and more specifically, an optimization of steps 1, 3, and 5 may be desired. As a result, a total increase in throughput of processing multiple substrates (and similarly, a decrease in total process time per substrate) may be obtained, which may be desirable. To that end, described below are a system and a method of processing multiple substrates concurrently.

Referring to FIG. 4, in a first embodiment, a system 10' is shown. System 10' may be analogous to that as system 10 described above with respect to FIG. 1, however, system 10' may comprise a second substrate 12*b* coupled to a second substrate chuck 14*b*. Second substrate 12*b* and second substrate chuck 14*b* may be analogous to that of first substrate 12*a* and first substrate chuck 14*a*, respectively, as described above with respect to FIG. 1. Second substrate chuck 14*b* may comprise a cavity 16*b* facing second substrate 12*b*. Second substrate 12*b* and second substrate chuck 14*b* may be supported on first and second stages 18 and 20. Second substrate 12*b* may further comprise a throughway 24*b*. However, in a further embodiment, second substrate 12*b* may be substantially absent of throughway 24*b*.

System 10' further comprises a second fluid dispenser 40*b*, analogous to that of first fluid dispenser 40*a*. As shown, second fluid dispenser 40*b* is coupled to template chuck 36; however, in a further embodiment, second fluid dispenser 40*b* may be coupled to any part of system 10, i.e. template 24 or imprint head 38. Control of second fluid dispenser 40*b* may be regulated by processor 58 that is in communication with second fluid dispenser 40*b*. Please note for simplicity of illustration, robot 52 is shown as two separate bodies and coupling between processor 58 and first and second stages 18 and 20 is not shown.

Figure 5:
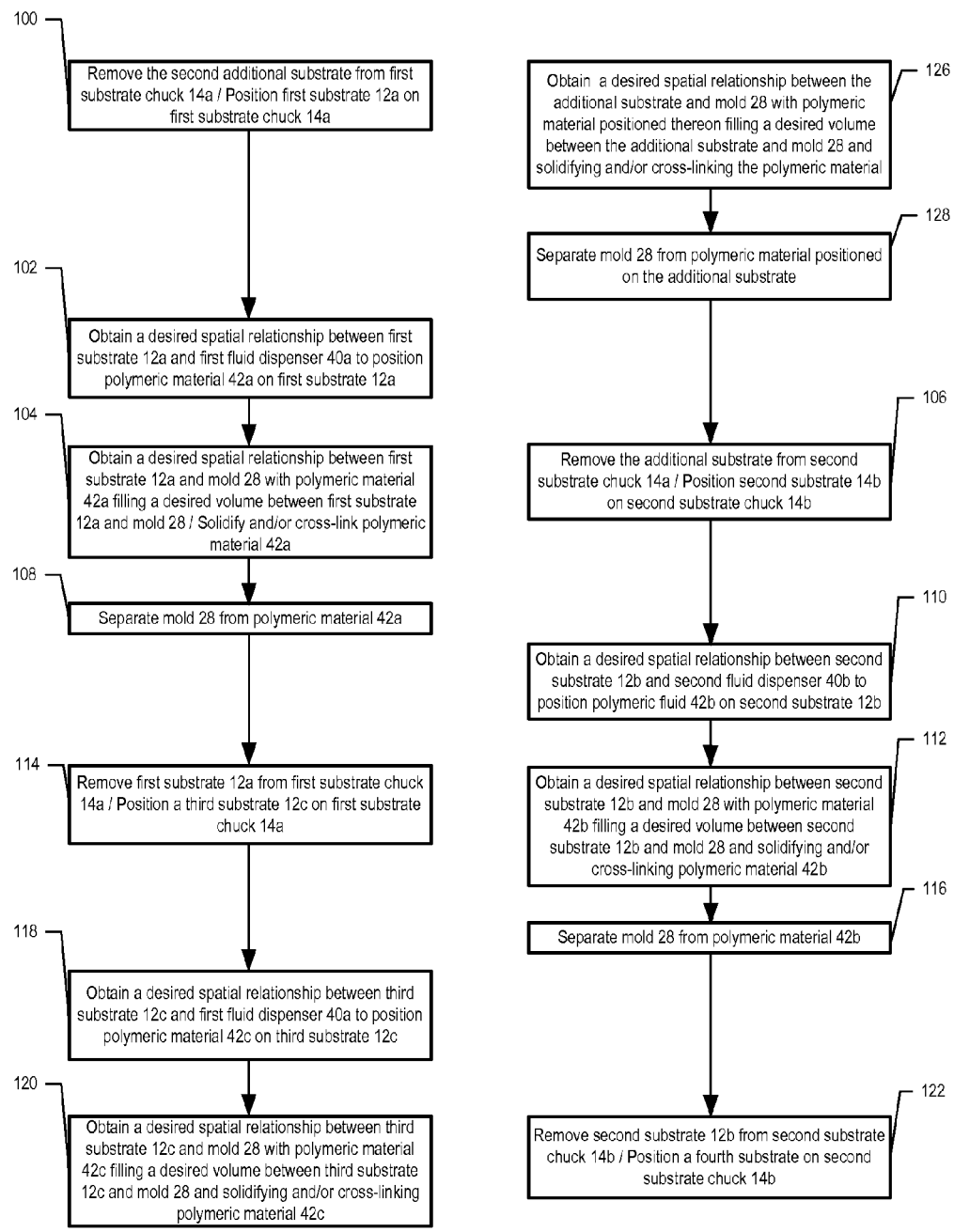
FIG. 5 is a flow diagram showing a method of patterning the first and second substrate shown in FIG. 4.
Figure 6:
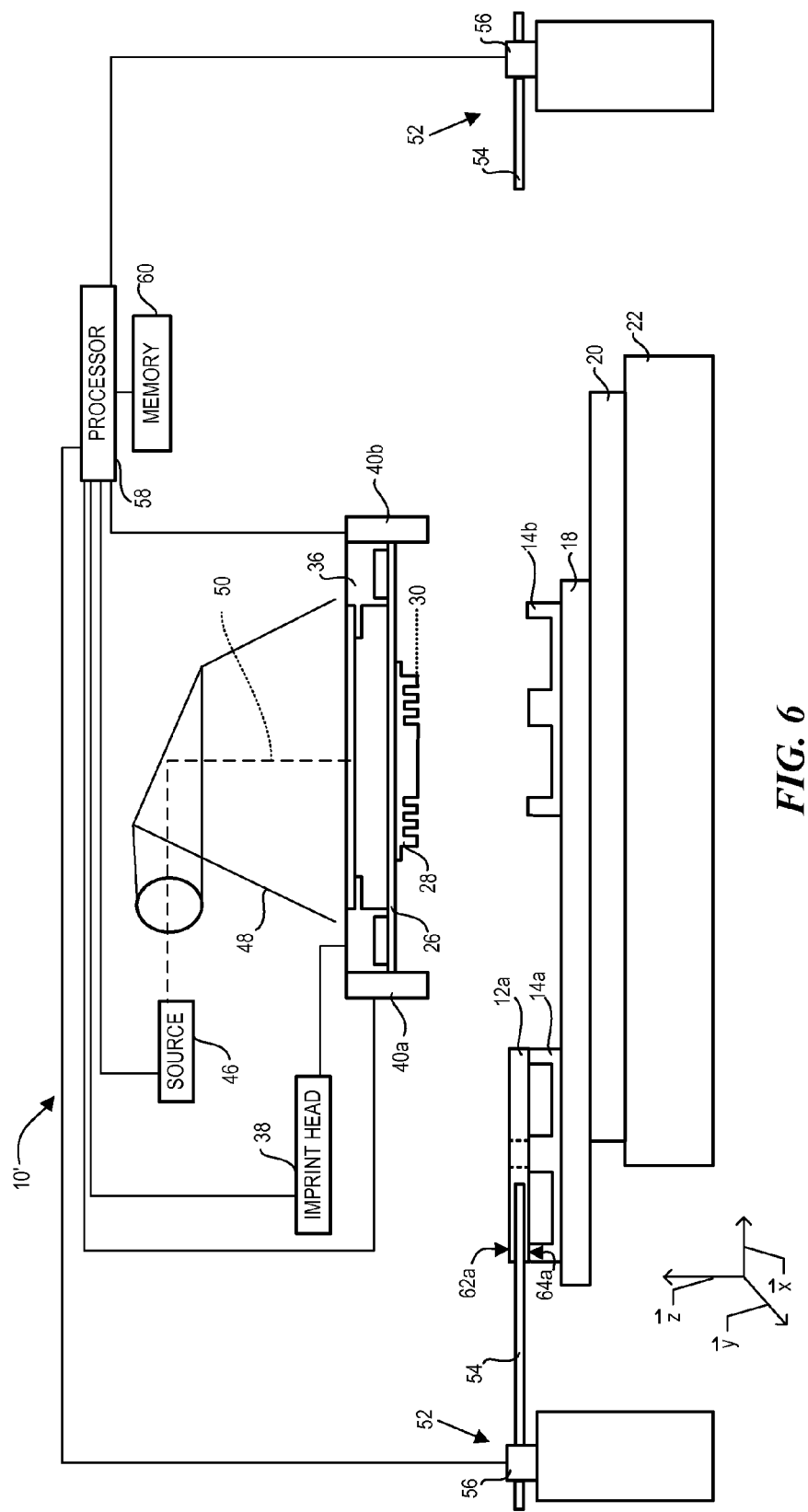
FIG. 6 is a simplified side view of the lithographic system shown in FIG. 4, with the robot positioning the first substrate on the first substrate chuck.

Referring to FIGS. 5 and 6, a process flow for processing first and second substrates 12a and 12b is shown. At step 100, first substrate 12a may be positioned upon first substrate chuck 14a. More specifically, first and second stages 18 and 20 may position first substrate chuck 14a in a desired spatial relationship with respect to robot 52 such that robot 52 may position first substrate 12a upon first substrate chuck 14a. Robot 52 may transfer first substrate 12a from the substrate cassette (not shown) and position the same upon first substrate chuck 14a.

Referring to FIGS. 5 and 7, at step 102, first and second stages 18 and 20 may translate first substrate chuck 14a such that a desired position may be obtained between first substrate 12a and first fluid dispenser 40a to position polymeric material 42a on first substrate 12a.

Referring to FIGS. 5 and 8, at step 104, a desired spatial relationship may be obtained between first substrate 12a and mold 28. More specifically, first and second stages 18 and 20 and imprint head 38 may position first substrate chuck 14a such that first substrate 12a may be in superimposition with mold 28 and further polymeric material 42a fills the desired volume between first substrate 12a and mold 28. Further, at step 104, after the desired volume is filled with polymeric material 42a, source 46 may produce energy 48, e.g., broadband ultraviolet radiation that causes polymeric material 42a to solidify and/or cross-link conforming to a shape of first substrate 12a and patterning surface 30 of mold 28. To that end, processing of second substrate 12b may occur concurrently with processing of first substrate 12a. More specifically, at step 106, concurrently with step 104, robot 52 may transfer second substrate 12b from the substrate cassette (not shown) and position the same upon second substrate chuck 14b.

Referring to FIGS. 5 and 9, at step 108, mold 28 may be separated from polymeric material 42a positioned on first substrate 12a. In a further embodiment, step 108 may occur concurrently with step 104 and step 106.

Referring to FIGS. 5 and 10, at step 110, first and second stages 18 and 20 may translate second substrate chuck 14b such that a desired position may be obtained between second substrate 12b and second fluid dispenser 40b to position polymeric material 42b on second substrate 12b. As shown polymeric material 42b may be positioned upon second substrate 12b as a plurality of spaced-apart droplets 44b.

Referring to FIGS. 5 and 11, at step 112, a desired spatial relationship may be obtained between second substrate 12b and mold 28. More specifically, first and second stages 18 and 20 and imprint head 38 may position second substrate chuck 14b such that second substrate 12b may be in superimposition with mold 28 and further polymeric material 42b fills the desired volume between second substrate 12b and mold 28. Further, at step 112, after the desired volume is filled with polymeric material 42b, source 46 may produce energy 48, e.g., broadband ultraviolet radiation that causes polymeric material 42b to solidify and/or cross-link conforming to a shape of second substrate 12b and patterning surface 30 of mold 28. At step 114, concurrently with step 112, robot 52 may remove first substrate 12a from first substrate chuck 14a and position the same within the substrate cassette (not shown) and further robot 52 may position a third substrate 12c, shown in FIG. 12, upon first substrate chuck 14a. Robot 52 may transfer third substrate 12c, shown in FIG. 12, from the substrate cassette (not shown) and position the same upon first substrate chuck 14a.

Referring to FIGS. 5 and 12, at step 116, mold 28 may be separated from polymeric material 42b positioned on second substrate 12b. In a further embodiment, step 116 may occur concurrently with step 112 and step 114.

Referring to FIGS. 5 and 13, at step 118, first and second stages 18 and 20 may translate third substrate 12c such that a desired position may be obtained between third substrate 12c and first fluid dispenser 40a to position polymeric material 42c on third substrate 12c. As shown polymeric material 42c may be positioned upon third substrate 12c as a plurality of spaced-apart droplets 44c.

Referring to FIGS. 5 and 14, at step 120, a desired spatial relationship may be obtained between third substrate 12c and mold 28. More specifically, first and second stages 18 and 20 and imprint head 38 may position first substrate chuck 14a such that third substrate 12c may be in superimposition with mold 28 and further polymeric material 42c fills the desired volume between third substrate 12c and mold 28. Further, at step 120, after the desired volume is filled with polymeric material 42c, source 46 may produce energy 48, e.g., broadband ultraviolet radiation that causes polymeric material 42c to solidify and/or cross-link conforming to a shape of third substrate 12c and patterning surface 30 of mold 28. At step 122, concurrently with step 120, robot 52 may remove second substrate 12b from second substrate chuck 14b and position the same within the substrate cassette (not shown) and further robot 52 may position a fourth substrate (not shown) upon second substrate chuck 14b. Robot 52 may transfer the fourth substrate (not shown) from the substrate cassette (not shown) and position the same upon second substrate chuck 14b. Third substrate 12c and the fourth substrate (not shown), both analogous to that of first substrate 12a, may be subjected to the aforementioned processing conditions, analogous to that of first and second substrates 12a and 12b.

Referring to FIGS. 4 and 5, furthermore, concurrently with patterning first substrate 12a, an additional substrate (not shown) may be patterned on second substrate chuck 14b prior to patterning of second substrate 12b. More specifically, at step 126, concurrently with step 100, the additional substrate (not shown), previously positioned on second substrate chuck 14b and having a polymeric material (not shown) positioned thereon, may have a pattern formed thereon analogous to that of step 112 shown in FIG. 11. Further, at step 128, mold 28 may be separated form the polymeric material (not shown) positioned on the additional substrate (not shown), analogous to that of step 116 shown in FIG. 12. To that end, step 106 may further include removing the additional substrate (not shown), analogous to that of step 122 shown in FIG. 14. Furthermore, step 100 may also further include removing a second additional substrate (not shown), previously patterned and positioned on first substrate chuck 14a prior to first substrate 12a, analogous to that of step 114 shown in FIG. 11.

In a further embodiment, first and second fluid dispensers 40a and 40b may be positioned outside of system 110, with first and second substrates 12a and 12b having polymeric material 42a and 42b, respectively, positioned thereon outside of system 110. In still a further embodiment, positioning of polymeric material 42a and 42b upon first and second substrate 12a and 12b may be optional.

To that end, in an example, the aforementioned patterning process for first and second substrates 12a and 12b may have a total process time per substrate of twenty (20) seconds. More specifically, the time for each step of the aforementioned patterning process is shown more clearly in Chart 2:

CHART 2

| First substrate 12a | Second substrate 12b | Process Time (sec) |
| --- | --- | --- |
| 1 Remove the second additional substrate 12a from first substrate chuck 14a/ Position first substrate 12a on first substrate chuck 14a | Obtain a desired spatial relationship between an additional substrate and mold 28 with polymeric material positioned thereon filling a desired volume between the additional substrate and mold 28 and solidifying and/or cross-linking the polymeric material/Separate mold 28 from polymeric material 42b | 19 |
| 2 Obtain a desired spatial relationship between first substrate 12a and first fluid dispenser 40a to position polymeric material 42a on first substrate 12a | | 1 |
| 3 Obtain a desired spatial relationship between first substrate 12a and mold 28 with polymeric material 42a filling a desired volume between first substrate 12a and mold 28 and solidifying and/or cross-linking polymeric material 42a/ Separate mold 28 from polymeric material 42a | Remove the additional substrate 12b from second substrate chuck 14b/Position second substrate 12b on second substrate chuck 14b | 19 |
| 4 | Obtain a desired spatial relationship between second substrate 12b and second fluid dispenser 40b to position polymeric material 42b on second substrate 12b | 1 |
| 5 Remove first substrate 12a from first substrate chuck 14a/ Position a third substrate 12c on first substrate chuck 14a | Obtain a desired spatial relationship between second substrate 12b and mold 28 with polymeric material 42b filling a desired volume between second substrate 12b and mold 28 and solidifying and/or cross-linking polymeric material 42b/Separate mold 28 from polymeric material 42b | 19 |
| Total/Substrate | | 20 |

To that end, the steps for the aforementioned method of processing first and second substrates 12a and 12b may be performed in parallel. More specifically, the steps of 1) positioning a substrate upon or removing a substrate from a substrate chuck and 2) obtaining a desired spatial relationship between the substrate and a mold with polymeric material filling a desired volume between the substrate and the mold and solidifying and/or cross-linking the polymeric material or separating the mold from the polymeric material occurs in parallel. As a result, a total increase in throughput of processing multiple substrates (and similarly, a decrease in total process time per substrate) may be obtained, which may be desirable.

Referring to FIG. 4, in a further embodiment, first and second stages 18 and 20 may rotate about a third axis extending orthogonal to first and second stages 18, i.e. the z axis, and may rotate for more than 180°.

Referring to FIGS. 4 and 15, as mentioned above, the aforementioned method may be employed to form a pattern on first sides 62a and 62b of first and second substrates 12a and 12b, respectively. To that end, in a further embodiment, it may be desired to form a pattern on second sides 64a and 64b of first and second substrates 12a and 12b, respectively, with second sides 64a and 64b being positioned opposite to that of first and second sides 62a and 62b, respectively.

Referring to FIGS. 6 and 15, a process flow for processing first and second sides 62a and 64a of first substrate 12a and first and second sides 62b and 64b of second substrate 12b, shown in FIG. 4, is shown. This may be desirable in the area of patterned media imprinting. At step 200, first substrate 12 may be positioned upon first substrate chuck 14a. More specifically, first and second stages 18 and 20 may position first substrate chuck 14a in a desired spatial relationship with respect to robot 52 such that robot 52 may position first substrate 12a upon first substrate chuck 14a. Robot 52 may transfer first substrate 12a from the substrate cassette (not shown) and position the same upon first substrate chuck 14a such that first side 62a may be positioned opposite to that of first substrate chuck 14a.

Referring to FIGS. 7 and 15, at step 202, first and second stages 18 and 20 may translate first substrate 12a such that a desired position may be obtained between first substrate 12a and first fluid dispenser 40a to position polymeric material 42a on first side 62a of first substrate 12a.

Referring to FIGS. 8 and 15, at step 204, a desired spatial relationship may be obtained between first substrate 12a and mold 28. More specifically, first and second stages 18 and 20 and imprint head 38 may position first substrate chuck 14a such that first substrate 12a may be in superimposition with mold 28 and further polymeric material 42a fills the desired volume between first substrate 12a and mold 28. Further, at step 104, after the desired volume is filled with polymeric material 42a, source 46 may produce energy 48, e.g., broadband ultraviolet radiation that causes polymeric material 42a to solidify and/or cross-link conforming to a shape of first side 62a of first substrate 12a and patterning surface 30 of mold 28. To that end, processing of second substrate 12b may occur concurrently with processing of first substrate 12a. More specifically, at step 206, concurrently with step 204, robot 52 may transfer second substrate 12b from the substrate cassette (not shown) and position the same upon second substrate chuck 14b such that first side 62b may be positioned opposite to that of second substrate chuck 14b.

Referring to FIGS. 9 and 15, at step 207, mold 28 may be separated from polymeric material 42a positioned on first side 62a of first substrate 12a. In a further embodiment, step 207 may occur concurrently with step 204 and step 206.

Referring to FIGS. 10 and 15, at step 208, first and second stages 18 and 20 may translate second substrate 12b such that a desired position may be obtained between second substrate 12b and second fluid dispenser 40b to position polymeric material 42b on first side 62b of second substrate 12b. As shown polymeric material 42*b*, may be positioned upon second substrate 12*b* as a plurality of spaced-apart droplets 44*b*.

Referring to FIGS. 15 and 16, at step 210, a desired spatial relationship may be obtained between second substrate 12*b* and mold 28. More specifically, first and second stages 18 and 20 and imprint head 38 may position second substrate chuck 14*b* such that second substrate 12*b* may be in superimposition with mold 28 and further polymeric material 42*b* fills the desired volume between second substrate 12*b* and mold 28. Further, at step 210, after the desired volume is filled with polymeric material 42*b*, source 46 may produce energy 48, e.g., broadband ultraviolet radiation that causes polymeric material 42*b* to solidify and/or cross-link conforming to a shape of first side 62*b* of second substrate 12*b* and patterning surface 30 of mold 28. At step 212, concurrently with step 210, robot 52 may remove first substrate 12*a* from first substrate chuck 14*a* and rotate arm 54 around its axis to flip first substrate 12*a* 180° with respect to mold 28 and further robot 52 may position first substrate 12*a* upon first substrate chuck 14*a* such that second side 64*a* may be positioned opposite to that of first substrate chuck 14*a*, as shown in FIG. 17. Furthermore, polymeric material 42*a* may be positioned within cavity 16*a* of first substrate chuck 14*a* to minimize, if not prevent, damage to polymeric material 42*a*.

Referring to FIGS. 15 and 17, at step 216, mold 28 may be separated from polymeric material 42*b* positioned on second substrate 12*b*. In a further embodiment, step 216 may occur concurrently with step 210 and step 212.

Referring to FIGS. 15 and 18, at step 218, first and second stages 18 and 20 may translate first substrate 12*a* such that a desired position may be obtained between first substrate 12*a* and first fluid dispenser 40*a* to position polymeric material 42*a*' on first substrate 12*a*. As shown polymeric material 42*a*' may be positioned upon first substrate 12*a* as a plurality of spaced-apart droplets 44*a*'.

Referring to FIGS. 15 and 19, at step 220, a desired spatial relationship may be obtained between first substrate 12*a* and mold 28. More specifically, first and second stages 18 and 20 and imprint head 38 may position first substrate chuck 14*a* such that first substrate 12*a* may be in superimposition with mold 28 and further polymeric material 42*a*' fills the desired volume between first substrate 12*a* and mold 28. Further, at step 220, after the desired volume is filled with polymeric material 42*a*', source 46 may produce energy 48, e.g., broadband ultraviolet radiation that causes polymeric material 42*a*' to solidify and/or cross-link conforming to a shape of second surface 64*a* of first substrate 12*a* and patterning surface 30 of mold 28. At step 222, concurrently with step 220, robot 52 may remove first substrate 12*a* from first substrate chuck 14*a* and rotate arm 54 around its axis to flip second substrate 12*b* 180° with respect to mold 28 and further robot 52 may position second substrate 12*b* upon second substrate chuck 14*b* such that second side 64*b* may be positioned opposite to that of second substrate chuck 14*b*, as shown in FIG. 20. Furthermore, polymeric material 42*b* may be positioned within cavity 16*b* of second substrate chuck 14*b* to minimize, if not prevent, damage to polymeric material 42*b*.

Referring to FIGS. 15 and 20, at step 224, mold 28 may be separated from polymeric material 42*a*' positioned on second side 64*a* of first substrate 12*a*. In a further embodiment, step 224 may occur concurrently with step 220 and step 222.

Referring to FIGS. 15 and 21, at step 226, first and second stages 18 and 20 may translate second substrate chuck 14*b* such that a desired position may be obtained between second substrate 12*b* and second fluid dispenser 40*b* to position polymeric material 42*b*' on second side 64*b* of second substrate 12*b*. As shown polymeric material 42*b*' may be positioned upon second substrate 12*b* as a plurality of spaced-apart droplets 44*b*'.

Referring to FIGS. 15 and 22, at step 228, a desired spatial relationship may be obtained between second substrate 12*b* and mold 28. More specifically, first and second stages 18 and 20 and imprint head 38 may position second substrate chuck 14*b* such that second substrate 12*b* may be in superimposition with mold 28 and further polymeric material 42*b*' fills the desired volume between second substrate 12*b* and mold 28. Further, at step 228, after the desired volume is filled with polymeric material 42*b*', source 46 may produce energy 48, e.g., broadband ultraviolet radiation that causes polymeric material 42*b*' to solidify and/or cross-link conforming to a shape of second side 64*b* of second substrate 12*b* and patterning surface 30 of mold 28. At step 230, concurrently with step 228, robot 52 may remove first substrate 12*a* from first substrate chuck 14*a* and position the same within the substrate cassette (not shown) and further robot 52 may position a third substrate 12*c* upon first substrate chuck 14*a*. Robot 52 may transfer third substrate 12*c* from the substrate cassette (not shown) and position the same upon first substrate chuck 14*a* such that first side 62*c* may be positioned opposite to that of first substrate chuck 14*a*.

Referring to FIGS. 15 and 23, at step 232, mold 28 may be separated from polymeric material 42*b*' positioned on second substrate 12*b*. In a further embodiment, step 232 may occur concurrently with step 228 and step 230.

Referring to FIGS. 15 and 24, at step 234, first and second stages 18 and 20 may translate third substrate 12*c* such that a desired position may be obtained between third substrate 12*c* and first fluid dispensers 40*a* to position polymeric material 42*c* on third substrate 12*c*. As shown polymeric material 42*c* may be positioned upon third substrate 12*c* as a plurality of spaced-apart droplets 44*c*.

Referring to FIGS. 15 and 25, at step 236, a desired spatial relationship may be obtained between third substrate 12*c* and mold 28. More specifically, first and second stages 18 and 20 and imprint head 38 may position first substrate chuck 14*a* such that third substrate 12*c* may be in superimposition with mold 28 and further polymeric material 42*c* fills the desired volume between third substrate 12*c* and mold 28. Further, at step 236, after the desired volume is filled with polymeric material 42*c*, source 46 may produce energy 48, e.g., broadband ultraviolet radiation that causes polymeric material 42*c* to solidify and/or cross-link conforming to a shape of first surface 62*c* of third substrate 12*c* and patterning surface 30 of mold 28. At step 238, concurrently with step 236, robot 52 may remove second substrate 12*b* from second substrate chuck 14*b* and position the same within the substrate cassette (not shown) and further robot 52 may position an additional substrate (not shown) upon second substrate chuck 14*b*. Robot 52 may transfer the additional substrate (not shown) from the substrate cassette (not shown) and position the same upon second substrate chuck 14*b*. Third substrate 12*c* and the additional substrate may be subjected to the aforementioned processing conditions, analogous to that of first and second substrates 12*a* and 12*b*.

Referring to FIGS. 4 and 15, furthermore, concurrently with patterning first substrate 12*a*, an additional substrate (not shown) may be patterned on second substrate chuck 14*b* prior to patterning of second substrate 12*b*. More specifically, at step 240, concurrently with step 200, the additional substrate (not shown), previously positioned on second substrate chuck 14*b* and having a polymeric material (not shown) positioned thereon, may have a pattern formed on a second side thereon analogous to that of step 228 shown in FIG. 22. Further, at step 242, mold 28 may be separated form the polymeric material (not shown) positioned on the additional substrate (not shown), analogous to that of step 232 shown in FIG. 23. To that end, step 206 may further include removing the additional substrate (not shown), analogous to that of step 238 shown in FIG. 25. Furthermore, step 200 may also further include removing a second additional substrate (not shown), previously patterned and positioned on first substrate chuck 13*a* prior to first substrate 12*a*, analogous to that of step 230, shown in FIG. 22.

To that end, in an example, the aforementioned process for patterning first and second sides 62*a* and 64*a* of first substrate 12*a* and first and second sides 62*b* and 64*b* of second substrate 12*b* may have a total process time per substrate of forty (40) seconds. More specifically, the time for each step of the aforementioned patterning process is shown more clearly in Chart 3:

material filling a desired volume between the substrate and the mold and solidifying and/or cross-linking the polymeric material or separating the mold from the polymeric material occurs in parallel. As a result, a total increase in throughput of processing multiple substrates (and similarly, a decrease in total process time per substrate) may be obtained, which may be desirable. To that end, the above-mentioned processes may be employed in imprint lithography systems including, inter alia, a step-and-repeat system and a whole wafer system. The selection of the system is known to one skilled in the art and typically depends on the specific application which is desired.

Referring to FIG. 26, in a further embodiment, system 110 may comprise any number of substrate chucks. In an example, system 110 may comprise a first and a second module 66*a* and 66*b*. First module 66*a* may comprise first and second substrate chucks 14*a* and 14*b* and second module 66*b* may comprise third and fourth substrate chucks 14*c* and 14*d*.

CHART 3

|   | First substrate 12a | Second substrate 12b | Process Time (sec) |
|---|---|---|---|
| 1 | Remove the second additional substrate from first substrate chuck 14a/ Position first substrate 12a on first substrate chuck 14a such that first side 62a faces mold 28 | Obtain a desired spatial relationship between an additional substrate and mold 28 with polymeric material positioned thereon filling a desired volume between the additional substrate and mold 28 and solidifying and/or cross-linking the polymeric material/Separate mold 28 from polymeric material 42b | 19 |
| 2 | Obtain a desired spatial relationship between first substrate 12a and first fluid dispenser 40a to position polymeric material 42a on first side 62a of first substrate 12a | | 1 |
| 3 | Obtain a desired spatial relationship between first substrate 12a and mold 28 with polymeric material 42a filling a desired volume between first substrate 12a and mold 28 and solidifying and/or cross-linking polymeric material 42a/ Separate mold 28 from polymeric material 42a | Remove the additional substrate 12b from second substrate chuck 12b/Position second substrate 12b on second substrate chuck 14b such that first side 62b faces mold 28 | 19 |
| 4 | | Obtain a desired spatial relationship between second substrate 12b and second fluid dispenser 40b to position polymeric material 42b on first side 62b of second substrate 12b | 1 |
| 5 | Remove first substrate 12a from first substrate chuck 12a/Flip first substrate 12a/Position first substrate 12a on first substrate chuck 14a such that second side 64a faces mold 28 | Obtain a desired spatial relationship between second substrate 12b and mold 28 with polymeric material 42b filling a desired volume between second substrate 12b and mold 28 and solidifying and/or cross-linking polymeric material 42b/Separate mold 28 from polymeric material 42b | 19 |
| 6 | Obtain a desired spatial relationship between first substrate 12a and first dispenser 40a to position polymeric material 42a' on second side 64a of first substrate 12a | | 1 |
| 7 | Obtain a desired spatial relationship between first substrate 12a and mold 28 with polymeric material 42a' filling a desired volume between first substrate 12a and mold 28 and solidifying and/or cross-linking polymeric material 42b/ Separate mold 28 from polymeric material 42b | Remove second substrate 12b from second substrate chuck 12b/Flip second substrate 12b/ Position second substrate 12b on second substrate chuck 14b such that a second side 64b faces mold 28 | 19 |
| 8 | | Obtain a desired spatial relationship between second substrate 12b and second fluid dispenser 40b to position polymeric material 42b on second side 64b of second substrate 12b | 1 |
|   | Total/Substrate | | 40 |

To that end, the steps for the aforementioned method of processing first and second sides 62*a* and 64*a* of first substrate 12*a* and first and second sides 62*b* and 64*b* of second substrate 12*b* may be performed in parallel. More specifically, analogous to that mentioned above with respect Chart 2, the steps of 1) positioning a substrate upon or removing a substrate from a substrate chuck and 2) obtaining a desired spatial relationship between the substrate and a mold with polymeric Third and fourth substrate chucks 14*c* and 14*d* may be analogous to that of first and second substrate chucks 14*a* and 14*b*, respectively, mentioned above with respect to FIG. 4. To that end, third and fourth substrate chucks 14*c* and 14*d* may have third and fourth substrates 12*c* and 12*d* positioned thereon, analogous to first and second substrate 12*a* and 12*b* mentioned above with respect to FIG. 4, and may be submitted to substantially the same processing conditions as mentioned above with respect to FIG. 15. More specifically, processing of first and second modules 66a and 66b may be occur in parallel, i.e., each module of first and second modules 66a and 66b may be subjected to the process as mentioned above with respect to FIG. 15, concurrently.

In an example, a substrate of first and second substrates 12a and 12b of first module 66a and a substrate of third and fourth substrates 12c and 12d of second module 66b may be patterned while concurrently the remaining substrate of first and second substrates 12a and 12b of first module 66a and the remaining substrate of third and fourth substrates 12c and 12d of second module 66b may be in the input/output process. More specifically, first substrate 12a may be patterned as analogous to that of steps 204 and 206 mentioned above with respect to FIGS. 8 and 15 and third substrate 12c may be patterned as analogous to that of steps 222 and 226 mentioned above with respect to FIGS. 15 and 22. Concurrently, second substrate 12b may be positioned upon second substrate chuck 14b as analogous to that of step 206 mentioned above with respect to FIGS. 8 and 15 and fourth substrate 12d may be removed (or removed and flipped) from fourth substrate chuck 14d analogous to that of step 230 mentioned above with respect to FIGS. 15 and 25 (or analogous to that of step 222 mentioned above with respect to FIGS. 15 and 19). Please note for simplicity of illustration, template 26 is shown as a dashed rectangle.

Referring to FIG. 27, in a further example, second substrate 12b may be patterned as analogous to that of steps 204 and 206 mentioned above with respect to FIGS. 8 and 15 and fourth substrate 12d may be patterned as analogous to that of step 226 mentioned above with respect to FIGS. 15 and 22. Concurrently, first substrate 12a may be positioned upon first substrate chuck 14a as analogous to that of step 206 mentioned above with respect to FIGS. 8 and 15 and third substrate 12c may be removed (or removed and flipped) from third substrate chuck 14c analogous to that of step 230 mentioned above with respect to FIGS. 15 and 25 (or analogous to that of step 222 mentioned above with respect to FIGS. 15 and 19).

To that end, employing first and second modules 66a and 66b and the process mentioned above with respect to FIG. 15, a substrate having a patterned formed on first and second sides thereof may be formed every n seconds, with n seconds being the time to pattern a side of the substrate.

Referring to FIG. 28, a cross-sectional view of first substrate chuck 14a having first substrate 12a positioned thereon is shown. First substrate chuck 14a may comprise a plurality of lands 68 positioned around an active area 80 of first substrate 12a. First substrate chuck 14a may further comprises a throughway 82 that may be in fluid communication with a pump system 84 to facilitate obtaining a desired pressure within cavity 16a. Control of pump system 84 may be regulated by processor 58.

Furthermore, it may be desired to subject first and second substrates 12a and 12b to substantially the same process conditions. To that end, referring to FIG. 29, a portion 86 of first substrate 12a, shown in FIG. 4, is depicted, wherein portion 86 displays a level of planarity of first side 62a of first substrate 12a. First side 62a comprises a plurality of hills and valleys; however, only hill 88 and valley 90 are shown. The plurality of hills and valleys of first side 62a define an average plane of planarity, shown as plane 'a,' of first side 62a. However, the plurality of hills and valleys of first side 62a may deviate from plane 'a' by differing magnitudes and wherein, for simplicity, each deviation may be defined as $\Delta_{dev1}$. More specifically, a zenith of hill 88 may deviate from plane 'a' a magnitude $\Delta_1$ and a nadir of valley 90 may deviate from plane 'a' a magnitude $\Delta_2$. The above may be equally applied to second side 64a of first substrate 12a as well as first and second sides 62b and 64b of second substrate 12b. Referring to FIG. 30, a portion 92 of first substrate chuck 14a, shown in FIG. 4, is depicted, wherein portion 92 displays a level of planarity of a surface 94 of first substrate chuck 14a. Surface 94 comprises a plurality of hills and valleys; however, only hill 96 and valley 98 are shown. The plurality of hills and valleys of surface 94 define an average plane of planarity, shown as plane 'b,' of surface 94. However, the plurality of hills and valleys of surface 94 may deviate from plane 'b' by differing magnitudes and wherein, for simplicity, each deviation may be defined as $\Delta_{dev2}$. More specifically, a zenith of hill 96 may deviate from plane 'b' a magnitude $\Delta_3$ and a nadir of valley 98 may deviate from plane 'b' a magnitude $\Delta_4$. The above may be equally applied to second substrate chuck 12b. To that end, $\Delta_{dev2}$, the deviation in thickness of surface 94 of substrate chuck 14b may be less than $\Delta_{dev1}$, the deviation in thickness of first side 62a (or second side 64a) of first substrate 12a. As a result, subjecting first and second substrates 12a and 12b to substantially the same process conditions may be facilitated.

Furthermore, first and second fluid dispensers 40a and 40b may be calibrated with respect to each other such that first and second substrates 12a and 12b may be subjected to substantially the same process conditions. More specifically, first fluid dispenser 40a may be instructed by processor 58 to position a volume $V_1$ of polymeric material 42a upon first substrate 12a; however, first fluid dispenser 40a may position a volume $V_2$ of polymeric material 42a upon first substrate 12a, with volume $V_2$ differing from volume $V_1$ and volume $V_1$ being the desired volume. This may result from a miscalibration of first fluid dispenser 40a, i.e. dispensing a different volume of fluid than instructed to. To that end, the difference between volumes $V_1$ and $V_2$ may be calculated such that processor 58, operating on computer readable program stored in memory 60, may instruct first fluid dispenser 40a to position a volume $V_3$ upon first substrate 12a to compensate for the miscalibration such that first fluid dispenser 40a may position volume $V_1$ upon first substrate 12a. The above may be equally applied to second fluid dispenser 40b. To that end, subjecting first and second substrates 12a and 12b to substantially the same process conditions may be facilitated.

Further, polymeric material 42a and 42b, positioned on first and second substrates 12a and 12b, respectively, may be subjected to differing evaporation conditions as a result of being positioned on differing substrate chucks, and thus, a volume of polymeric material 42a and 42b may differ, which is undesirable. More specifically, an air flow and temperature of an environment associated with polymeric material 42a, first substrate 12a, and first substrate chuck 14a may differ that an environment associated with polymeric material 42b, second substrate 42b, and second substrate chuck 14b. As a result, first fluid dispenser 40a may position a volume $V_4$ of polymeric material 42a upon first substrate 12a and second fluid dispenser 40b may positioned a volume $V_5$, differing from volume $V_4$, of polymeric material 42b upon second substrate 12b to compensate for the aforementioned evaporative conditions such that after exposure of polymeric material 42a and 42b to the evaporative conditions, polymeric material 42a and 42b comprises a volume $V_6$ and $V_7$, respectively, with volumes $V_6$ and $V_7$ being substantially the same.

Furthermore, a geometric location of first and second fluid dispensers 40a and 40b with respect to first and second substrates 12a and 12b, respectively, may be substantially the same to facilitate subjecting first and second substrates 12a and 12b to substantially the same process conditions. More specifically, a distance between first fluid dispenser 40a and first substrate 12a may be substantially the same as a distance between second fluid dispenser 40b and second substrate 40b.

To further facilitate first and second substrates 12a and 12b being subjected to substantially the same process conditions, a reflectivity of surface 94 of first and second substrate chucks 14a and 14b may be substantially the same such that the solidification and/or cross-linking of first and second materials 42a and 42b may be substantially the same.

The embodiments of the present invention described above are exemplary. Many changes and modifications may be made to the disclosure recited above, while remaining within the scope of the invention. Therefore, the scope of the invention should not be limited by the above description, but instead should be determined with reference to the appended claims along with their full scope of equivalents.

What is claimed is:

1. A nano-imprint lithography system for patterning first and second substrates, the system comprising:
   a nano-imprint mold assembly;
   a translation stage spaced-apart from the nano-imprint mold assembly;
   first and second fluid dispensers constructed to position nano-imprint fluid on the first and second substrates, respectively;
   a first substrate chuck coupled to the translation stage, the first substrate chuck constructed to provide for positioning of the first substrate thereon, the first substrate chuck having a surface with a cavity formed therein and configured such that polymeric material formed on a surface of the first substrate may be positioned within the cavity;
   a second substrate chuck coupled to the translation stage, constructed to provide for positioning of the second substrate thereon, the second substrate chuck having a surface with a cavity formed therein and configured such that polymeric material formed on a surface of the second substrate may be positioned within the cavity;
   wherein the translation stage is constructed to alternatively place the first and second substrate chucks in first and second positions with respect to the nano-imprint mold assembly such that the nano-imprint mold assembly may imprint a pattern on one of the first and second substrates while concurrently obtaining a desired spatial relationship to position the remaining substrate of the first and second substrates upon either the first or second substrate chuck; and with the system being calibrated such that the first and second substrate are subjected to substantially the same process conditions.

2. The system as recited in claim 1 wherein the translation stage further comprises a theta stage that may rotate about an axis perpendicular to the theta stage.

3. The system as recited in claim 1 further including a robot to position the first and second substrates upon the first and second substrate chucks, respectively, and further remove the first and second substrates from the first and second substrate chucks, respectively.

4. The system as recited in claim 1 wherein the system further comprises a plurality of substrate chucks.

5. The system as recited in claim 1 wherein the system further comprises a plurality of fluid dispensers.

6. A nano-imprint lithography system for patterning first, second, third, and fourth substrates, the system comprising:
   a first module comprising:
      a first nano-imprint mold assembly;
      a first and a second substrate chuck constructed to provide for positioning of the first and second substrates thereon, respectively, the first and second substrate chucks each having a surface with a cavity formed therein and configured such that polymeric material formed on surfaces of the first and second substrates may be positioned within the cavities of the first and second substrate chucks, respectively;
   a second module comprising:
      a second nano-imprint mold assembly;
      a third and a fourth substrate chuck constructed to provide for positioning of the third and fourth substrates thereon, respectively, the third and fourth substrate chucks each having a surface with a cavity formed therein and configured such that polymeric material formed on surfaces of the third and fourth substrates may be positioned within the cavities of the third and fourth substrate chucks, respectively;
   a translation stage spaced-apart from the first and the second nano-imprint mold assemblies having the first, second, third, and fourth substrate chucks coupled thereto, with the translation stage alternatively placing the substrate chucks positions with respect to the first and second nano-imprint mold assemblies, respectively, such that in the first position the first nano-imprint mold assembly may imprint a pattern on one of the first and second substrates and the second nano-imprint mold assembly may imprint a pattern on one of the third and fourth substrates while concurrently obtaining a desired spatial relationship to position the remaining substrate of the first and second substrates upon either the first or second substrate chuck and obtaining a desired spatial relationship to position the remaining substrate of the third and fourth substrates upon either the third or fourth substrate chuck.

7. The system as recited in claim 6 further including first and second fluid dispensers to position fluid on the first, second, third, and fourth substrates.

8. The system as recited in claim 6 wherein the translation stage further comprises a theta stage that may rotate about an axis perpendicular to the theta stage.

9. The system as recited in claim 6 further including a robot to position the first, second, third, and fourth substrates upon the first, second, third, and fourth substrate chucks, respectively, and further remove the first, second, third, and fourth substrates from the first, second, third, and fourth substrate chucks, respectively.

10. The system as recited in claim 6, where the system is calibrated such that the first, second, third, and fourth substrates are subjected to substantially the same process conditions.

11. A nano-imprint lithography system for patterning first and second substrates, the system comprising:
   a nano-imprint mold assembly;
   a translation stage spaced-apart from the nano-imprint mold assembly;
   first and second fluid dispensers constructed to position nano-imprint fluid on the first and second substrates, respectively;
   a first substrate chuck coupled to the translation stage, the first substrate chuck constructed to provide for positioning of the first substrate thereon, the first substrate chuck having a surface with a first cavity formed therein and configured such that polymeric material formed on a surface of the first substrate may be positioned within the first cavity;
   a second substrate chuck coupled to the translation stage, the second substrate chuck constructed to provide for positioning of the second substrate thereon, the second substrate chuck having a surface with a cavity formed therein and configured such that polymeric material formed on a surface of the second substrate may be positioned within the cavity;

wherein the translation stage is constructed to alternatively place the first and second substrate chucks in first and second positions with respect to the nano-imprint mold assembly such that the nano-imprint mold assembly may imprint a pattern on one of the first and second substrates while concurrently obtaining a desired spatial relationship between the remaining substrate of the first and second substrates and either the first or second substrate chuck.

12. The system as recited in claim 11 wherein the translation stage further comprises a theta stage that may rotate about an axis perpendicular to the theta stage.

13. The system as recited in claim 11 further including a robot to position the first and second substrates upon the first and second substrate chucks, respectively, and further remove the first and second substrates from the first and second substrate chucks, respectively.

14. The system as recited in claim 11 wherein the system further comprises a plurality of substrate chucks.

15. The system as recited in claim 11 wherein the translation stage is constructed to alternatively place the first and second substrate chucks in first and second positions by flipping the first substrate substantially 180 degrees relative to the nano-imprint mold assembly.

16. The system as recited in claim 11 wherein the system further comprises a plurality of fluid dispensers.

17. The system as recited in claim 11 wherein the first fluid dispenser system is coupled to the nano-imprint mold assembly.

18. The system as recited in claim 17 wherein the second fluid dispenser is coupled to the nano-imprint mold assembly.

* * * * *